(12) United States Patent
Do et al.

(10) Patent No.: US 12,406,904 B2
(45) Date of Patent: Sep. 2, 2025

(54) INTEGRATED CIRCUIT DEVICE INCLUDING NORMAL CELLS AND THROUGH VIA SUPPLYING BACKSIDE POWER TO FRONTSIDE POWER GATING CELL

(71) Applicant: SAMSUNG ELECTRONICS CO., LTD., Suwon-si (KR)

(72) Inventors: Jungho Do, Hwaseong-si (KR); Sanghoon Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 655 days.

(21) Appl. No.: 17/562,428

(22) Filed: Dec. 27, 2021

(65) Prior Publication Data
US 2022/0208757 A1    Jun. 30, 2022

(30) Foreign Application Priority Data

Dec. 28, 2020   (KR) .................. 10-2020-0185205

(51) Int. Cl.
| | |
|---|---|
| H01L 23/48 | (2006.01) |
| H01L 23/522 | (2006.01) |
| H01L 23/528 | (2006.01) |
| H01L 23/535 | (2006.01) |
| H10D 89/10 | (2025.01) |

(Continued)

(52) U.S. Cl.
CPC ........ *H01L 23/481* (2013.01); *H01L 23/5226* (2013.01); *H01L 23/5286* (2013.01); *H01L 23/535* (2013.01); *H10D 89/10* (2025.01); *H10D 84/0149* (2025.01); *H10D 84/0158* (2025.01); *H10D 84/0186* (2025.01); *H10D 84/038* (2025.01); *H10D 84/981* (2025.01)

(58) Field of Classification Search
CPC ............... H01L 23/481; H01L 23/5226; H01L 23/5286; H01L 23/535; H01L 27/0207
See application file for complete search history.

(56) References Cited

U.S. PATENT DOCUMENTS

| | | | |
|---|---|---|---|
| 7,590,962 | B2 | 9/2009 | Frenkil et al. |
| 9,287,257 | B2 | 3/2016 | Chao et al. |

(Continued)

OTHER PUBLICATIONS

Communication issued on Mar. 25, 2025 from the Korean Intellectual Property Office for Korean Patent Application No. 10-2020-0185205.

*Primary Examiner* — Ratisha Mehta
*Assistant Examiner* — Brad A Knudson
(74) *Attorney, Agent, or Firm* — Sughrue Mion, PLLC

(57) ABSTRACT

An integrated circuit device is provided. The integrated circuit device includes: a substrate with a first active area and a second active area spaced apart from each other in a first horizontal direction; a plurality of normal cells arranged on a first surface of the substrate; a power wiring structure arranged on a second surface of the substrate; and a power gating cell arranged on the first surface of the substrate. The power gating cell includes: a sleep control transistor arranged in the first active area; and a through via penetrating the second active area of the substrate. The power gating cell is configured to provide a virtual power voltage to the plurality of normal cells through a virtual power line based on a power voltage supplied from the power wiring structure through the through via and a power line.

20 Claims, 31 Drawing Sheets

(51) Int. Cl.
  *H10D 84/01*  (2025.01)
  *H10D 84/03*  (2025.01)
  *H10D 84/90*  (2025.01)

(56) References Cited

U.S. PATENT DOCUMENTS

| | | | |
|---|---|---|---|
| 9,754,923 | B1 | 9/2017 | Xie et al. |
| 9,786,685 | B2 | 10/2017 | Lee |
| 9,900,005 | B2 | 2/2018 | Chen et al. |
| 10,615,122 | B2 | 4/2020 | Kishishita |
| 2001/0022399 | A1* | 9/2001 | Koubuchi ............... H01L 24/10 |
| | | | 257/773 |
| 2008/0012424 | A1* | 1/2008 | Shin ..................... G11C 5/063 |
| | | | 307/69 |
| 2017/0287933 | A1* | 10/2017 | Chen ................... H01L 27/0207 |
| 2018/0130786 | A1* | 5/2018 | Deepak ............ H01L 29/42372 |
| 2018/0145030 | A1* | 5/2018 | Beyne ............... H01L 21/76251 |
| 2018/0254778 | A1* | 9/2018 | Rios ..................... G06F 30/398 |
| 2019/0305773 | A1 | 10/2019 | Olsen |
| 2020/0042668 | A1 | 2/2020 | Peng et al. |
| 2020/0083166 | A1 | 3/2020 | Lin et al. |
| 2020/0134128 | A1 | 4/2020 | Peng et al. |
| 2020/0203276 | A1 | 6/2020 | Hiblot et al. |
| 2020/0373242 | A1 | 11/2020 | Hiblot et al. |
| 2021/0082815 | A1* | 3/2021 | Doornbos ............. H01L 23/481 |
| 2022/0139900 | A1* | 5/2022 | Oh ..................... H01L 23/5286 |
| | | | 257/351 |
| 2023/0361028 | A1* | 11/2023 | Doornbos ........... H01L 27/0688 |

\* cited by examiner

A1 – A1'

A2 – A2'

A3 − A3'

INTEGRATED CIRCUIT DEVICE INCLUDING NORMAL CELLS AND THROUGH VIA SUPPLYING BACKSIDE POWER TO FRONTSIDE POWER GATING CELL

CROSS-REFERENCE TO RELATED APPLICATION

This application is based on and claims priority under from Korean Patent Application No. 10-2020-0185205, filed on Dec. 28, 2020, in the Korean Intellectual Property Office, the disclosure of which is incorporated by reference herein in its entirety.

BACKGROUND

The disclosure relates to an integrated circuit device, and more particularly, to an integrated circuit device including a field effect transistor.

As electronic devices are required to be miniaturized, multifunctional, and deliver high performance, high-capacity integrated circuit devices are required, and an increased degree of device integration is required to provide high-capacity integrated circuit devices. For example, field effect transistors (FETs) having a small size may reduce the area of an integrated circuit, but there is a problem in that an operating speed decreases due to the complexity of a wiring structure for an integrated circuit device having a small size. Therefore, in order to achieve the functions and operating speed required for an integrated circuit device, it may be important to design the integrated circuit device in consideration of the degree of device integration and performance.

SUMMARY

Example embodiments provide an integrated circuit device including a field-effect transistor with improved integration and electrical performance.

According to an aspect of an example embodiment, an integrated circuit device includes: a substrate with a first active area and a second active area spaced apart from each other in a first horizontal direction; a plurality of normal cells arranged on a first surface of the substrate; a power wiring structure arranged on a second surface of the substrate; and a power gating cell arranged on the first surface of the substrate. The power gating cell includes: a sleep control transistor arranged in the first active area; and a through via penetrating the second active area of the substrate. The power gating cell is configured to provide a virtual power voltage to the plurality of normal cells through a virtual power line based on a power voltage supplied from the power wiring structure through the through via and a power line.

According to an aspect of an example embodiment, an integrated circuit device includes: a substrate with a first active area and a second active area spaced apart from each other in a first horizontal direction; a plurality of normal cells arranged on a first surface of the substrate; a power wiring structure arranged on a second surface of the substrate; and a power gating cell arranged on the first surface of the substrate. The power gating cell includes: a sleep control transistor arranged in the first active area; and a through via penetrating the second active area of the substrate, and electrically connected to the power wiring structure. The sleep control transistor includes: a gate electrode arranged in the first active area and configured to receive a sleep control signal; a first impurity area arranged on a first side of the gate electrode; and a second impurity area arranged on a second side of the gate electrode opposite to the first side.

According to an aspect of an example embodiment, an integrated circuit device includes: a substrate with a first active area and a second active area spaced apart from each other in a first horizontal direction; a plurality of normal cells arranged on a first surface of the substrate; a power wiring structure arranged on a second surface of the substrate; and a power gating cell arranged on the first surface of the substrate. The power gating cell includes: a through via penetrating the second active area of the substrate; a sleep control transistor in the first active area, the sleep control transistor including: a gate electrode arranged in the first active area and configured to receive a sleep control signal; a first impurity area arranged on a first side of the gate electrode; and a second impurity area arranged on a second side of the gate electrode opposite to the first side; a virtual power line configured to apply a virtual power voltage to the first impurity area; and a power line configured to apply a power voltage supplied from the power wiring structure through the through via to the second impurity area, the power line vertically overlapping the through via.

BRIEF DESCRIPTION OF THE DRAWINGS

The above and other aspects will be more clearly understood from the following description of example embodiments taken in conjunction with the accompanying drawings in which.

DETAILED DESCRIPTION OF EXAMPLE EMBODIMENTS

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Reference will now be made in detail to example embodiments, examples of which are illustrated in the accompanying drawings.

Figure 1:
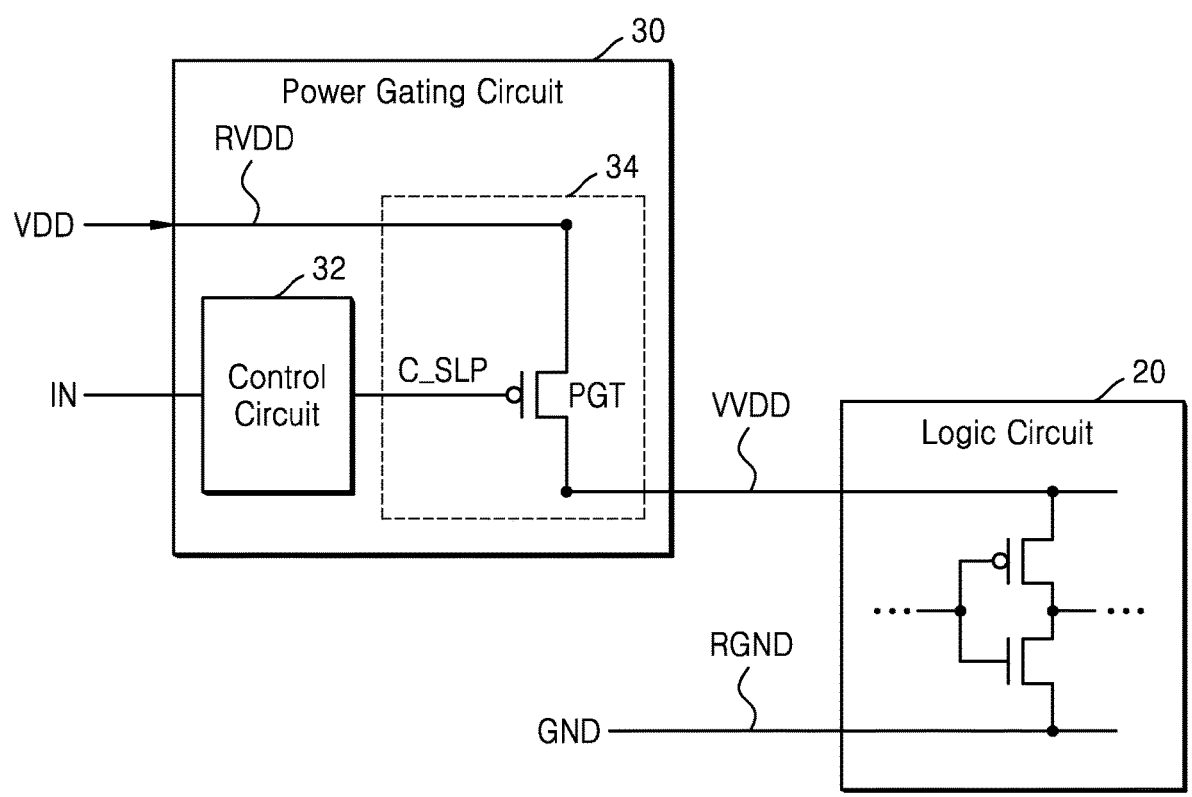
FIG. 1 is a block diagram of an integrated circuit device including a power gating circuit according to example embodiments.

FIG. 1 is a block diagram of an integrated circuit device 10 including a power gating circuit, according to example embodiments.

Referring to FIG. 1, the integrated circuit device 10 may include a logic circuit 20 and a power gating circuit 30 that provides power to the logic circuit 20. The logic circuit 20 may be connected to a first virtual power line VVDD and a second power line RGND, and may receive power through the first virtual power line VVDD and the second power line RGND. In an example embodiment, the second power line RGND may be a ground line, and the logic circuit 20 may be applied with a ground voltage GND through the second power line RGND.

In an example embodiment, the integrated circuit device 10 may be a System-On-Chip (SOC). For example, the integrated circuit device 10 may be a mobile SOC, an application processor, a media processor, a microprocessor, a central processing unit (CPU), or a similar device.

The power gating circuit 30 may be connected to a first power line RVDD providing a power voltage VDD. The power gating circuit 30 may adjust a first driving voltage provided to the logic circuit 20, and may adjust a power mode of the logic circuit 20 by selectively connecting the first power line RVDD to the first virtual power line VVDD in response to a control signal IN.

For example, the power gating circuit 30 may provide the power voltage VDD to the logic circuit 20 by connecting the first power line RVDD to the first virtual power line VVDD in a power-on mode, and the power gating circuit 30 may float the first virtual power line VVDD by blocking the first power line RVDD and the first virtual power line VVDD from each other in a power-off mode.

The integrated circuit device 10 may further include a power management circuit, and the control signal IN may be provided from an external power management circuit of the power gating circuit 30. The power management circuit of the integrated circuit device 10 may apply the control signal IN to the power gating circuit 30 so that a voltage level provided to the logic circuit 20 varies according to a power mode.

The logic circuit 20 may selectively receive power through the first virtual power line VVDD. The logic circuit 20 may be provided with a first driving voltage according to a power mode. For example, the logic circuit 20 may be provided with the power voltage VDD in the power-on mode, and the power may be cut off in the power-off mode. In FIG. 1, the integrated circuit device 10 is driven in the power-on mode and the power-off mode. However, alternatively, the integrated circuit device 10 may be further configured to be driven in one or more retention modes in addition to the power-on mode and the power-off mode.

The logic circuit 20 may include any circuit connected to the first virtual power line VVDD. For example, the logic circuit 20 may include at least one of an inverter, a NAND gate, an AND gate, a NOR gate, an OR gate, an XOR gate, an XNOR gate, a multiplexer, an adder, a latch, a flip-flop, and the like.

The power gating circuit 30 may include a sleep control transistor unit 34 connected between the first power line RVDD and the first virtual power line VVDD, and a control circuit 32 providing switching signals C_SLP to the sleep control transistor unit 34. In other example embodiments, unlike that shown in FIG. 1, the power gating circuit 30 may not include the control circuit 32, and the sleep control transistor unit 34 may directly receive the switching signals C_SLP from the outside of the power gating circuit 30. In example embodiments, the sleep control transistor unit 34 may include a sleep control transistor PGT which is a p-type metal oxide semiconductor transistor (PMOS) as shown in FIG. 1. However, the sleep control transistor unit 34 may also be implemented by one or more of various types of different transistor.

For example, in the power-on mode, the control circuit 32 may generate a switching signal C_SLP at a logic low level for turning on the sleep control transistor unit 34, and the first virtual power line VVDD may be connected to the logic circuit 20 by the sleep control transistor unit 34 according to the switching signal C_SLP. In the power-off mode, the control circuit 32 may generate the switching signal C_SLP at a logic high level for turning off the sleep control transistor unit 34, and the sleep control transistor unit 34 may be turned off by the switching signal C_SLP and the first virtual power line VVDD may be cut off from the first power line RVDD and floated.

Figure 2:
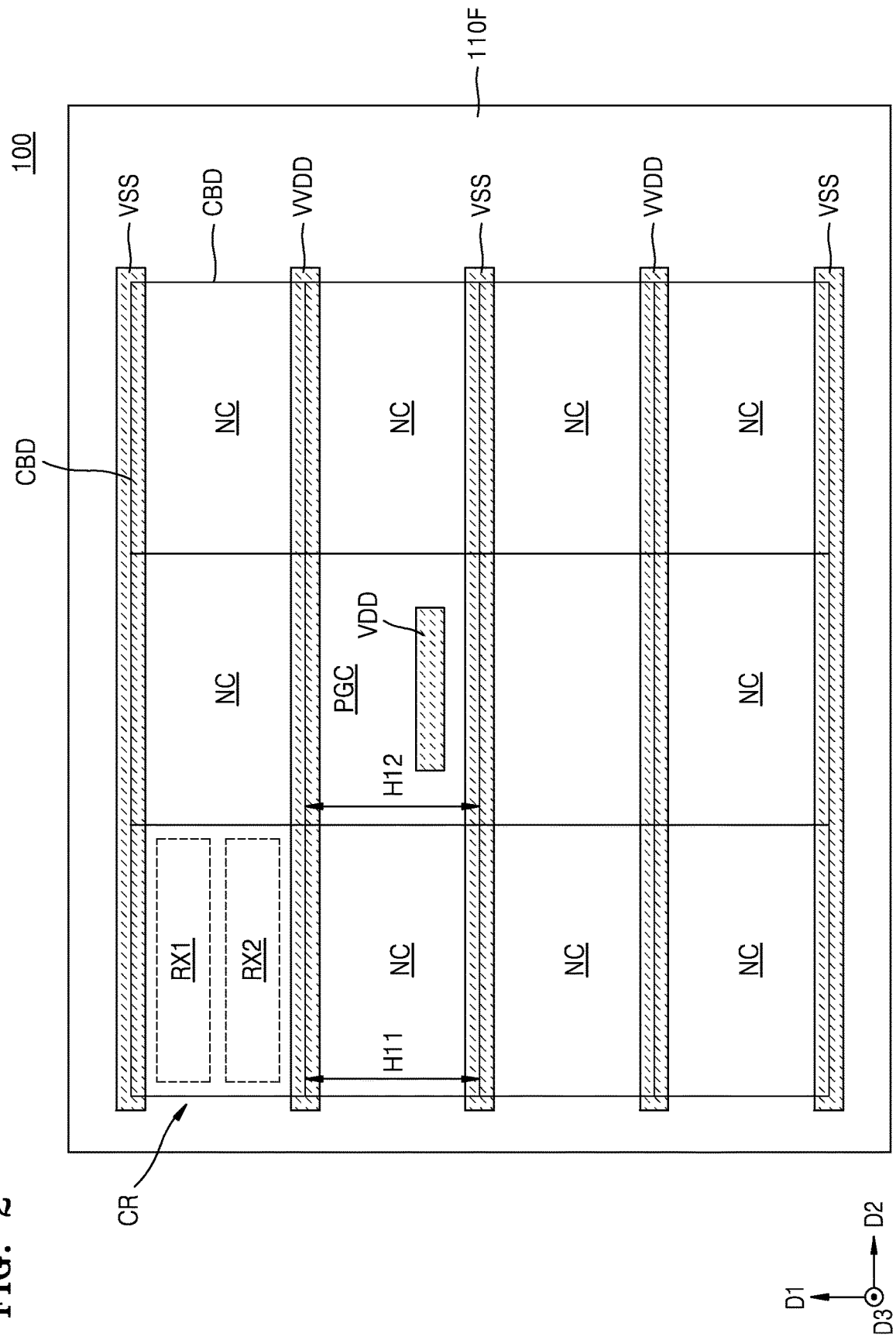
FIG. 2 is a schematic view of an integrated circuit device according to example embodiments.
Figure 3:
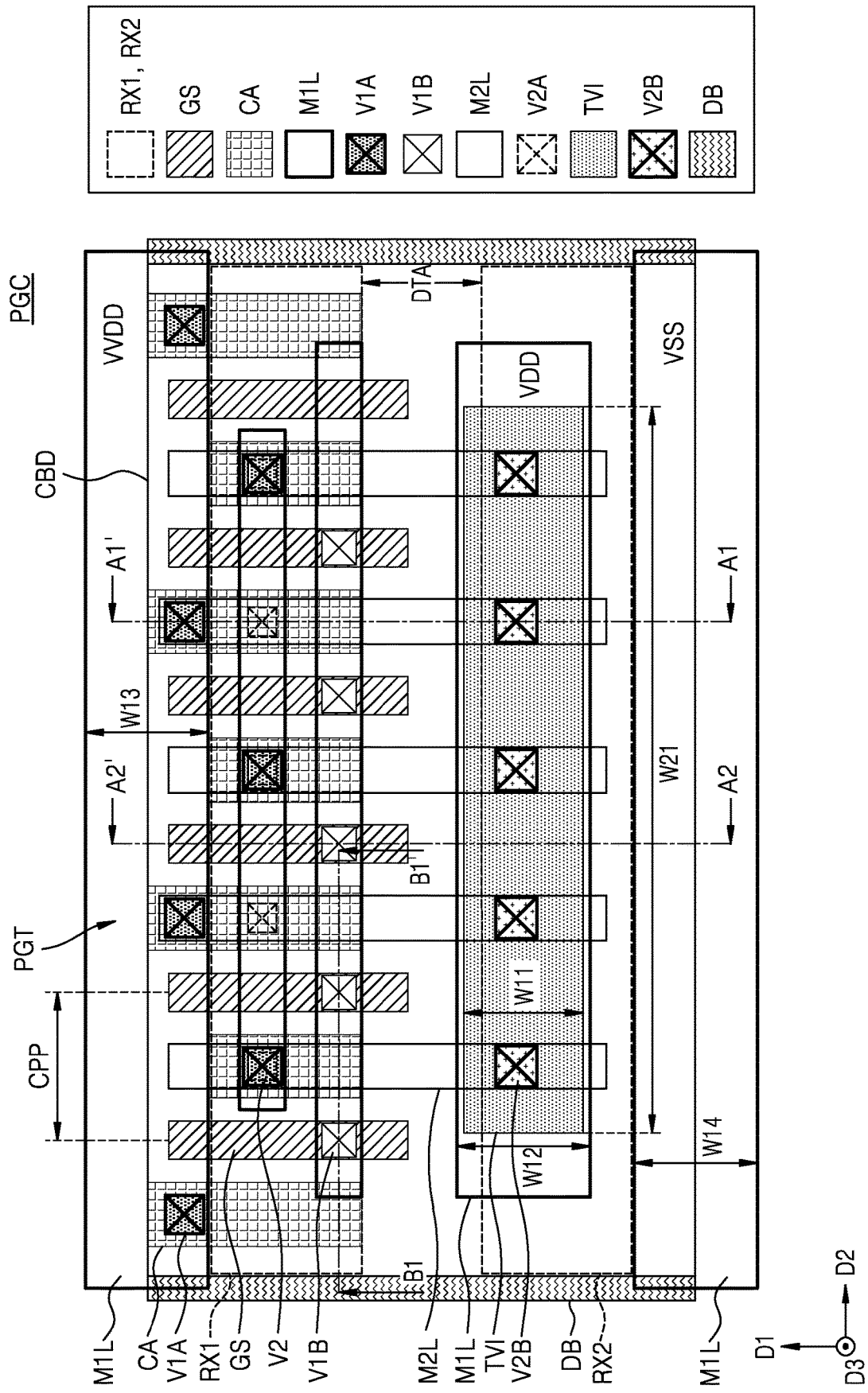
FIG. 3 is a layout diagram of a power gating cell of FIG. 2.
Figure 4:
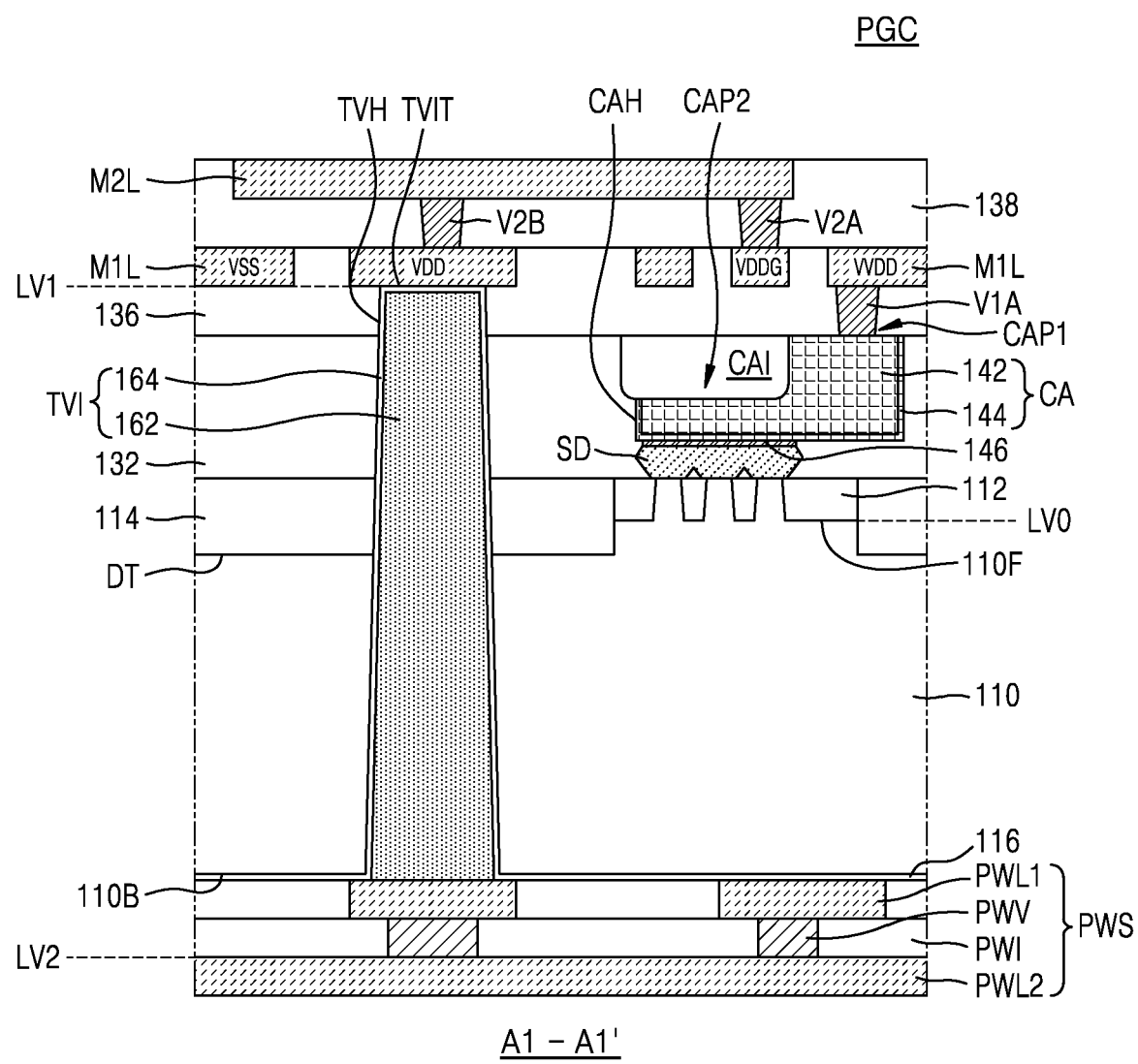
FIG. 4 is a cross-sectional view of the power gating cell, taken along line A1-A1' of FIG. 3.
Figure 5:
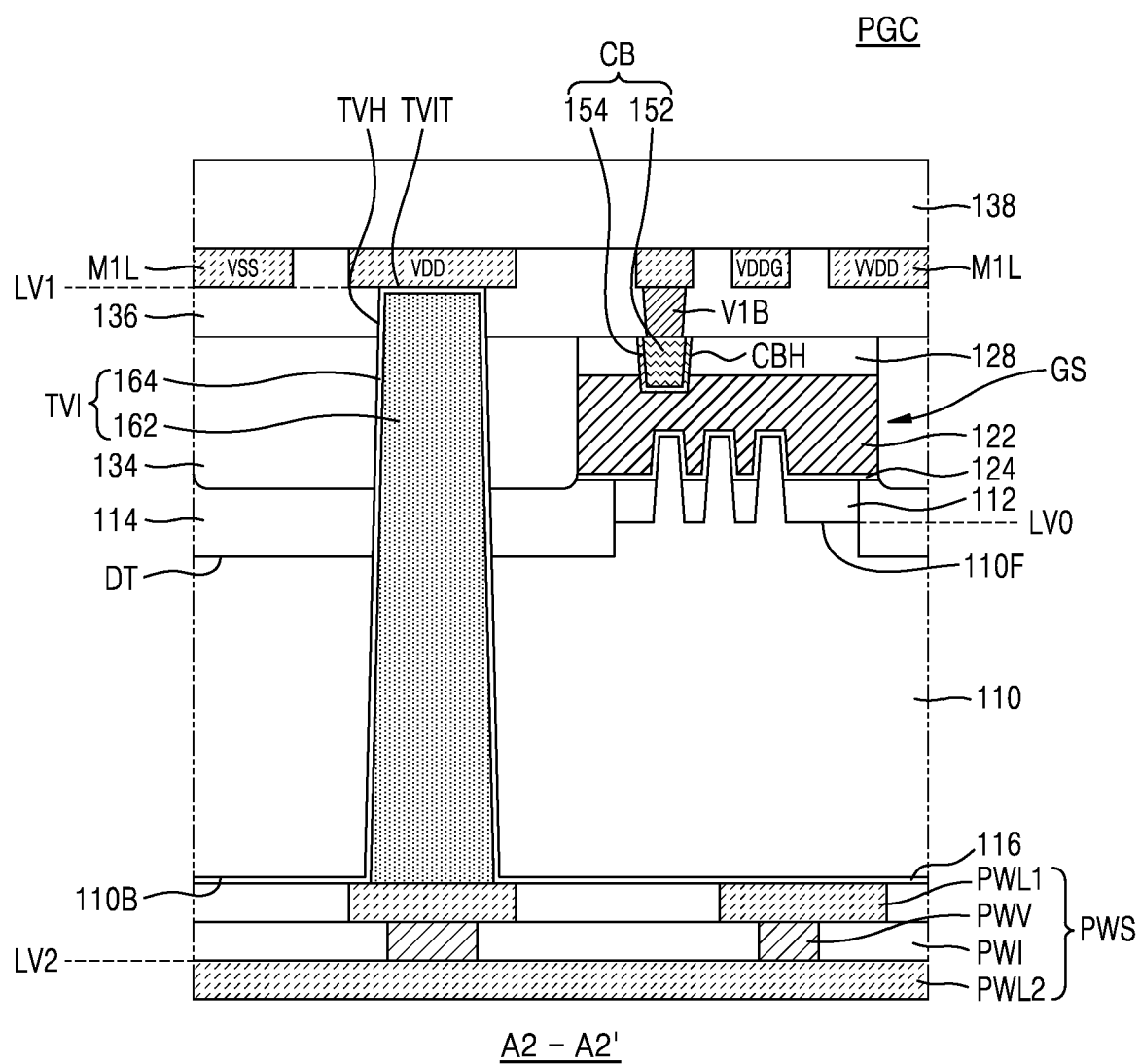
FIG. 5 is a cross-sectional view of the power gating cell, taken along line A2-A2' of FIG. 3.
Figure 6:
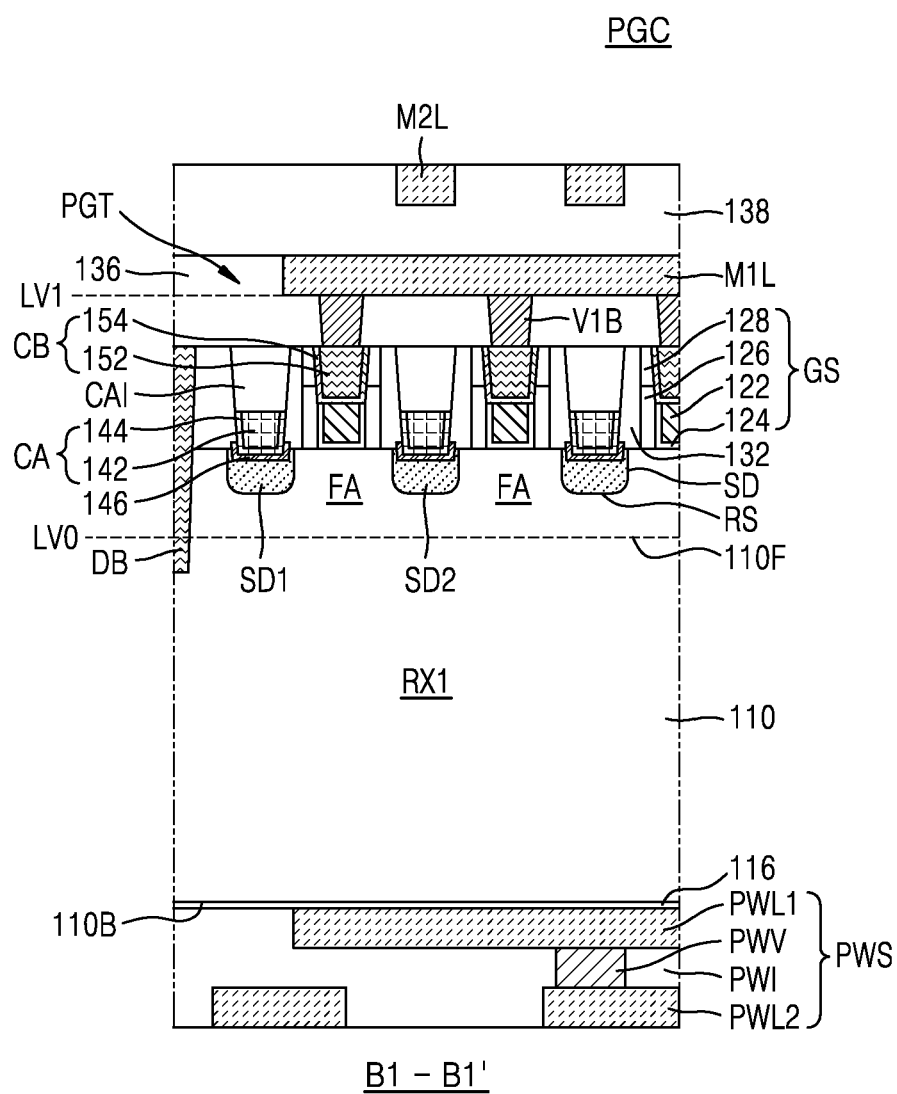
FIG. 6 is a cross-sectional view of the power gating cell, taken along line B1-B1' of FIG. 3.

FIG. 2 is a schematic view of an integrated circuit device 100 according to example embodiments. FIG. 3 is a schematic layout diagram of a power-gating cell PGC of FIG. 2. FIG. 4 is a cross-sectional view of the power gating cell PGC, taken along line A1-A1' of FIG. 3, FIG. 5 is a cross-sectional view of the power gating cell PGC, taken along line A2-A2' of FIG. 3, and FIG. 6 is a cross-sectional view of the power gating cell, taken along line B1-B1' of FIG. 3.

Referring to FIGS. 2 to 6, the integrated circuit device 100 may include a plurality of cell areas CR arranged on a first surface 110F of a substrate 110 and a power wiring structure PWS arranged on a second surface 110B of the substrate 110.

The plurality of cell areas CR may be arranged in a matrix form in a first horizontal direction D1 and a second horizontal direction D2 parallel to the first surface 110F of the substrate 110. Each of the plurality of cell areas CR may be an area in which various types of logic cells included in the logic circuit 20 (See FIG. 1) are arranged.

In the example embodiments shown in FIGS. 2 to 6, the integrated circuit device 100 may constitute a logic cell including a finFET device. However, example embodiments are not limited thereto, and the integrated circuit device 100 may include a planar FET device, a gate-all-around type FET device, a multi-bridge channel FET (MBCFET) device, and a FET device based on a two-dimensional material such as a $MoS_2$ semiconductor gate electrode.

For example, the plurality of cell areas CR may include a plurality of normal cells NC and the power-gating cell PGC. For example, power-gating cells PGC may be distributed and arranged at predetermined intervals in the plurality of cell areas CR. In a plan view, the power-gating cell PGC may be surrounded by the plurality of normal cells NC.

On the first surface 110F of the substrate 110, a plurality of ground lines VSS and a plurality of virtual power lines VVDD are alternately apart from each other in the first horizontal direction D1, and may extend in the second horizontal direction D2. Accordingly, a cell boundary CBD of one cell area CR in the first horizontal direction D1 may be arranged to overlap one ground line VSS and one virtual power line VVDD. Here, a normal cell NC having the cell boundary CBD vertically overlapping both one ground line VSS and one virtual power line VVDD adjacent thereto may be referred to as a single height cell. The normal cell NC, which is a single height cell, may have a first height H11 in the first horizontal direction D1.

The cell boundary CBD of the power gating cell PGC may be arranged to overlap one virtual power line VVDD and one ground line VSS, and a power line VDD extending in the second horizontal direction D2 parallel to the plurality of ground lines VSS may be on the power gating cell PGC. The cell boundary CBD of the power-gating cell PGC may not vertically overlap the power line VDD. The power-gating cell PGC may also be a single height cell. The power-gating cell PGC may have a second height H12 in the first horizontal direction D1, and the second height H12 may be substantially the same as the first height H11.

The cell boundary CBD of the power-gating cell PGC may be arranged to overlap a separation structure DB. The separation structure DB extends in the first horizontal direction D1, and may electrically insulate the power-gating cell PGC from a normal cell NC adjacent thereto, and two adjacent normal cells NC from among the plurality of normal cells NC in the second horizontal direction D2.

As illustrated in FIGS. 2 and 3, the substrate 110 may include a first active area RX1 and a second active area RX2 apart from each other in the first horizontal direction D1. For example, each of the plurality of cell areas CR may be arranged to include the first active area RX1 and the second active area RX2. For example, the first active area RX1 may be an area in which a PMOS transistor is formed, and the second active area RX2 may be an area in which an NMOS transistor is formed.

For example, the substrate 110 may include a Group IV semiconductor such as Si or Ge, a Group IV-IV compound semiconductor such as SiGe or SiC, or a Group III-V compound semiconductor such as GaAs, InAs, or InP. A plurality of fin-type active areas FA may protrude from the first surface 110F of the substrate 110 to extend in the second horizontal direction D2. A device isolation layer 112 may be on the first surface 110F of the substrate 110 to cover a lower sidewall of a fin-type active area FA.

As exemplarily shown in FIGS. 3 to 5, the first active area RX1 and the second active area RX2 may be arranged to be apart from each other by a deep trench isolation layer 114. The deep trench isolation layer 114 may fill a deep trench DT formed on the first surface 110F of the substrate 110 and may include, for example, an insulating material.

The power gating cell PGC may include the sleep control transistor PGT formed in the first active area RX1 and a through via TVI formed in the second active area RX2.

The sleep control transistor PGT is formed in the first active area RX1 and may be configured as a PMOS transistor. A plurality of gate structures GS may extend in the first horizontal direction D1 to cross the fin-type active area FA, and may be arranged to be apart from each other in the second horizontal direction D2 by a first gate interval CPP. Each of the plurality of gate structures GS may include a gate electrode 122, a gate-insulating layer 124, a gate spacer 126, and a gate capping layer 128. For example, the gate electrode 122 may extend in the first horizontal direction D1 to cross the fin-type active area FA, and the gate-insulating layer 124 may be between the gate electrode 122 and the fin-type active area FA. The gate spacers 126 may be on both sidewalls of the gate electrode 122, and the gate capping layer 128 may extend in the first horizontal direction D1 above the gate electrode 122 and the gate spacer 126.

The gate electrode 122 may include doped polysilicon, a metal, a conductive metal nitride, a conductive metal carbide, a conductive metal silicide, or a combination thereof. For example, the gate electrode 122 may include, but is not limited to, aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminum (TiAl), titanium aluminum nitride (TiAlN), tantalum carbide nitride (TaCN), tantalum carbide (TaC), tantalum silicon nitride (TaSiN), or a combination thereof. In example embodiments, the gate electrode 122 may include a work function metal-containing layer and a gap-fill metal layer. The work function metal-containing layer may include at least one metal selected from Ti, W, ruthenium (Ru), niobium (Nb), Mo, hafnium (Hf), nickel (Ni), cobalt (Co), platinum (Pt), ytterbium (Yb), terbium (Tb), dysprosium (Dy), erbium (Er), and palladium (Pd). The gap-fill metal layer may include a W layer or an Al layer. In example embodiments, the gate electrode 122 may include, but is not limited to, a stack structure of TiAlC/TiN/W, a stack structure of TiN/TaN/TiAlC/TiN/W, or a stack structure of TiN/TaN/TiN/TiAlC/TiN/W.

The gate-insulating layer 124 may be between the fin-type active area FA and the gate electrode 122, and between the device isolation layer 112 and the gate electrode 122. The gate-insulating layer 124 may include a silicon oxide film, a silicon oxynitride film, a high-k film having a dielectric constant higher than that of the silicon oxide film, or a combination thereof. The high-k film may include a metal oxide or a metal oxynitride. For example, the high-k film usable as the gate-insulating layer 124 may include, but is not limited to, $HfO_2$, HfSiO, HfSiON, HfTaO, HfTiO, HfZrO, $ZrO_2$, $Al_2O_3$, or a combination thereof.

The gate spacer 126 covers both sidewalls of the gate electrode 122 and may extend in the first horizontal direction D1. The gate spacer 126 may include silicon oxide ($SiO_x$), silicon nitride ($SiN_x$), silicon oxynitride ($SiO_xN_y$), silicon carbonitride ($SiC_xN_y$), silicon oxide carbonitride ($SiO_xC_yN_z$), or a combination thereof.

The gate capping layer 128 covers upper surfaces of the gate electrode 122 and the gate spacer 126 and may extend in the first horizontal direction D1. In example embodiments, the gate capping layer 128 may include silicon nitride or silicon oxynitride.

A via V1B and a first wiring layer M1L may be electrically connected to the plurality of gate structures GS so that the switching signal C_SLP is supplied from the control circuit 32 to the plurality of gate structures GS.

A recess area RS extending into the fin-type active area FA on both sides of a gate structure GS may be formed, and a source/drain area SD may be formed inside the recess area RS. The source/drain area SD is formed in the recess area RS and may have a plurality of inclined sidewalls. The source/drain area SD may include, but is not limited to, a doped SiGe layer, a doped Ge layer, a doped SiC layer, or a doped InGaAs layer. The recess area RS may be formed by removing portions of the fin-type active areas FA on both sides of the gate structure GS, and the source/drain area SD may be formed by growing a semiconductor layer filling the recess area RS by an epitaxy process.

In example embodiments, the source/drain area SD may include a plurality of semiconductor layers having different compositions from each other. For example, the source/drain area SD may include a lower semiconductor layer, an upper semiconductor layer, and a capping semiconductor layer sequentially provided to fill the recess area RS. For example, each of the lower semiconductor layer, the upper semiconductor layer, and the capping semiconductor layer includes SiC and may have different amounts of Si and C.

For example, as illustrated in FIG. 6, the sleep control transistor PGT may include the gate structure GS in the first active area RX1, a first impurity area SD1 on a first side of the gate structure GS, and a second impurity area SD2 on a second side of the gate structure GS. The first impurity area SD1 may indicate the source/drain area SD on the first side of the gate structure GS, and the second impurity area SD2 may indicate the source/drain area SD on the second side of the gate structure GS. The first impurity area SD1 and the second impurity area SD2 may correspond to a source area and a drain area of the sleep control transistor PGT, and may be electrically connected to the virtual power line VVDD and the power line VDD, respectively.

An inter-gate insulating layer 132 may be formed between the gate structures GS to cover the source/drain area SD. The inter-gate insulating layer 132 may include silicon oxide or silicon oxynitride.

A source/drain contact CA may be on the source/drain area SD. For example, the source/drain contact CA may include a contact plug 142 and a conductive barrier layer 144 arranged in the source/drain contact hole CAH penetrating the inter-gate insulating layer 132. The contact plug 142 may include at least one of tungsten (W), cobalt (Co), nickel (Ni), ruthenium (Ru), copper (Cu), aluminum (Al), silicide thereof, or an alloy thereof. The conductive barrier layer 144 may include at least one of ruthenium (Ru), titanium (Ti), titanium nitride (TiN), tantalum (Ta), tantalum nitride (TaN), tungsten (W), titanium silicon nitride (TiSiN), titanium silicide (TiSi), and tungsten silicide (WSi). A metal silicide layer 146 may be further arranged between the source/drain contact CA and the source/drain area SD.

In some example embodiments, as shown in FIG. 4, the source/drain contact CA may include a first portion CAP1 and a second portion CAP2 having an upper surface level lower than that of the first portion CAP1, and a contact cover insulating layer CAI may be on the second part CAP2. For example, the second portion CAP2 may be a portion of the remaining source/drain contact CA after removing a portion of an upper side of the source/drain contact CA by a contact recess process. In other example embodiments, unlike shown in FIG. 4, the source/drain contact CA may have an upper surface maintaining substantially the same level over its entire length.

A gate contact CB may be on the gate structure GS. The gate contact CB may include a contact plug 152 and a conductive barrier layer 154 surrounding sidewalls and a bottom surface of the contact plug 152. The gate contact CB may be arranged inside a gate contact hole CBH that penetrates the gate capping layer 128 and exposes an upper surface of the gate electrode 122.

The gate structure GS may extend in the first horizontal direction D1, and an end portion of the gate structure GS in the first horizontal direction D1 may contact a gate isolation insulating layer 134. The gate isolation-insulating layer 134 may be formed by removing a portion of the gate structure GS extending in a line shape and filling the removed portion with an insulating material.

A first interlayer insulating layer 136 may be on the inter-gate insulating layer 132, the gate isolation-insulating layer 134, and the gate structure GS, and a second interlayer insulating layer 138 may be arranged on the first interlayer insulating layer 136. The first interlayer insulating layer 136 and the second interlayer insulating layer 138 may include an oxide layer, a nitride layer, an ultra-low-k (ULK) layer having an ultra-low dielectric constant k of about 2.2 to about 2.4, or a combination thereof.

A first lower via V1A and a second lower via V1B may pass through the first interlayer insulating layer 136 and may be respectively connected to the source/drain contact CA and the gate contact CB. The first lower via V1A and the second lower via V1B may be electrically connected to a plurality of first wiring layers M1L. For example, the plurality of first wiring layers M1L may be arranged to extend in the second horizontal direction D2. When the first surface 110F of the substrate 110 is at a reference vertical level LV0, the plurality of first wiring layers M1L may have a bottom surface at a first vertical level LV1.

For example, a first wiring layer M1L overlapping a cell boundary CBL from among the plurality of first wiring layers M1L is referred to as the virtual power line VVDD, and a virtual power voltage may be applied to the virtual power line VVDD. A first wiring layer M1L overlapping the other cell boundary CBL from among the plurality of first wiring layers M1L is referred to as the ground line VSS, and a ground voltage may be applied to the ground line VSS. The first wiring layer M1L electrically connected to the gate electrode 122 of the sleep control transistor PGT from among the plurality of first wiring layers M1L is referred to as a sleep control line VDDG, and a sleep control signal may be applied to the sleep control line VDDG. Sidewalls of the plurality of first wiring layers M1L may be covered by the first interlayer insulating layer 136.

A first upper via V2A and a second upper via V2B may be between the plurality of first wiring layers M1L and a plurality of second wiring layers M2L, and the first upper via V2A, the second upper via V2B, and the plurality of second wiring layers M2L may be surrounded by the second inter-layer insulating layer 138. For example, the plurality of second wiring layers M2L may be arranged to extend in the first horizontal direction D1. FIGS. 4 and 5 exemplarily illustrate a two-layer wiring structure including the plurality of first wiring layers M1L extending in the second horizontal direction D2 and the plurality of second wiring layers M2L extending in the first horizontal direction D1. In some example embodiments, one to five wiring layers having different vertical levels may be further arranged on the plurality of second wiring layers M2L.

The through via TVI may be on the second active area RX2. As shown in FIGS. 4 and 5, the through via TVI may extend in a vertical direction D3 within a through via hole TVH penetrating the substrate 110, the deep trench isolation layer 114, the inter-gate insulating layer 132, and the gate isolation insulating layer 134.

As shown in FIG. 3, the through via TVI may have a first width W11 in the first horizontal direction D1, and the first width W11 may range from about 10 nm to about 500 nm, but is not limited thereto. In addition, the through via TVI may have a first length W21 in the second horizontal direction D2, and the first length W21 may range from about 50 nm to about 900 nm, but is not limited thereto.

The through via TVI may include a via conductive layer 162 and a conductive liner 164. The conductive liner 164 may be on an inner wall of the through via hole TVH, and the via conductive layer 162 may fill the inside of the through via hole TVH.

A first wiring layer M1L vertically overlapping the through via TVI from among the plurality of first wiring layers M1L may be referred to as the power line VDD. An end TVIT of the through via TVI may contact a bottom surface of the power line VDD. For example, the end TVIT of the through via TVI may be at the same level as the first vertical level LV1. The power line VDD is on the second active area RX2 and the second upper via V2B is on the through via TVI to be connected to the plurality of second wiring layers M2L. Accordingly, as shown in FIG. 4, electrical signals may be transmitted from the through via TVI to the sleep control line VDDG via the power line VDD, the second upper via V2B, a second wiring layer M2L, and the first upper via V2A.

In example embodiments, the power line VDD may have a second width W12 in the first horizontal direction D1, and the second width W12 may range from about 50 nm to about 600 nm. The second width W12 may be greater than the first width W11 in the first horizontal direction D1 of the through via TVI, and the entire end TVIT of the through via TVI may be covered by the power line VDD. The virtual power line VVDD may have a third width W13 in the first horizontal direction D1, and the third width W13 may range from about 50 nm to about 600 nm. The ground line VSS may have a fourth width W14 in the first horizontal direction D1, and the fourth width W14 may range from about 50 nm to about 600 nm. The third width W13 and the fourth width W14 may be less than or equal to the second width W12 of the power line VDD, but are not limited thereto.

A power wiring structure PWS may be on the second surface 110B of the substrate 110. The power wiring structure PWS may include a first power wiring layer PWL1, a conductive via PWV, a second power wiring layer PWL2, and a wiring insulating layer PWI. A rear-insulating layer 116 may be on the second surface 110B of the substrate 110, and the first power-wiring layer PWL1, the conductive via PWV, and the second power-wiring layer PWL2 may be sequentially arranged on the rear-insulating layer 116. For example, the second power-wiring layer PWL2 may have an upper surface at a second vertical level LV2 lower than the reference vertical level LV0. The wiring-insulating layer PWI may be on the rear-insulating layer 116 to surround sidewalls of the first power-wiring layer PWL1, the conductive via PWV, and the second power-wiring layer PWL2.

In example embodiments, the power wiring structure PWS may have a uni-directional wiring structure in which the first power wiring layer PWL1 extends in the first horizontal direction D1 and the second power wiring layer PWL2 extends in the second horizontal direction D2, but is not limited thereto. In addition, although the power wiring structure PWS is exemplarily illustrated as having a two-layer wiring structure, the number of wiring layers is not limited thereto.

According to example embodiments, the sleep control transistor PGT may be in the first active area RX1 of the power gating cell PGC, the through via TVI may be in the second active area RX2 of the power gating cell PGC, and a power voltage may be supplied to the sleep control transistor PGT from the power wiring structure PWS on the second surface 110B of the substrate 110 through the power line VDD on the through via TVI. Accordingly, a virtual power voltage may be applied to the plurality of normal cells NC (see FIG. 2) adjacent to the power-gating cell PGC through the virtual power line VVDD.

According to example embodiments, the integrated circuit device 100 including the power-gating cell PGC may minimize power use in a standby state, and thus, may perform a low-power operation. In addition, as the power wiring structure PWS is on the second surface 110B of the substrate 110, the degree of freedom for routing to the normal cell NC may be improved, and the degree of integration of the integrated circuit device 100 may be improved.

Figure 7:
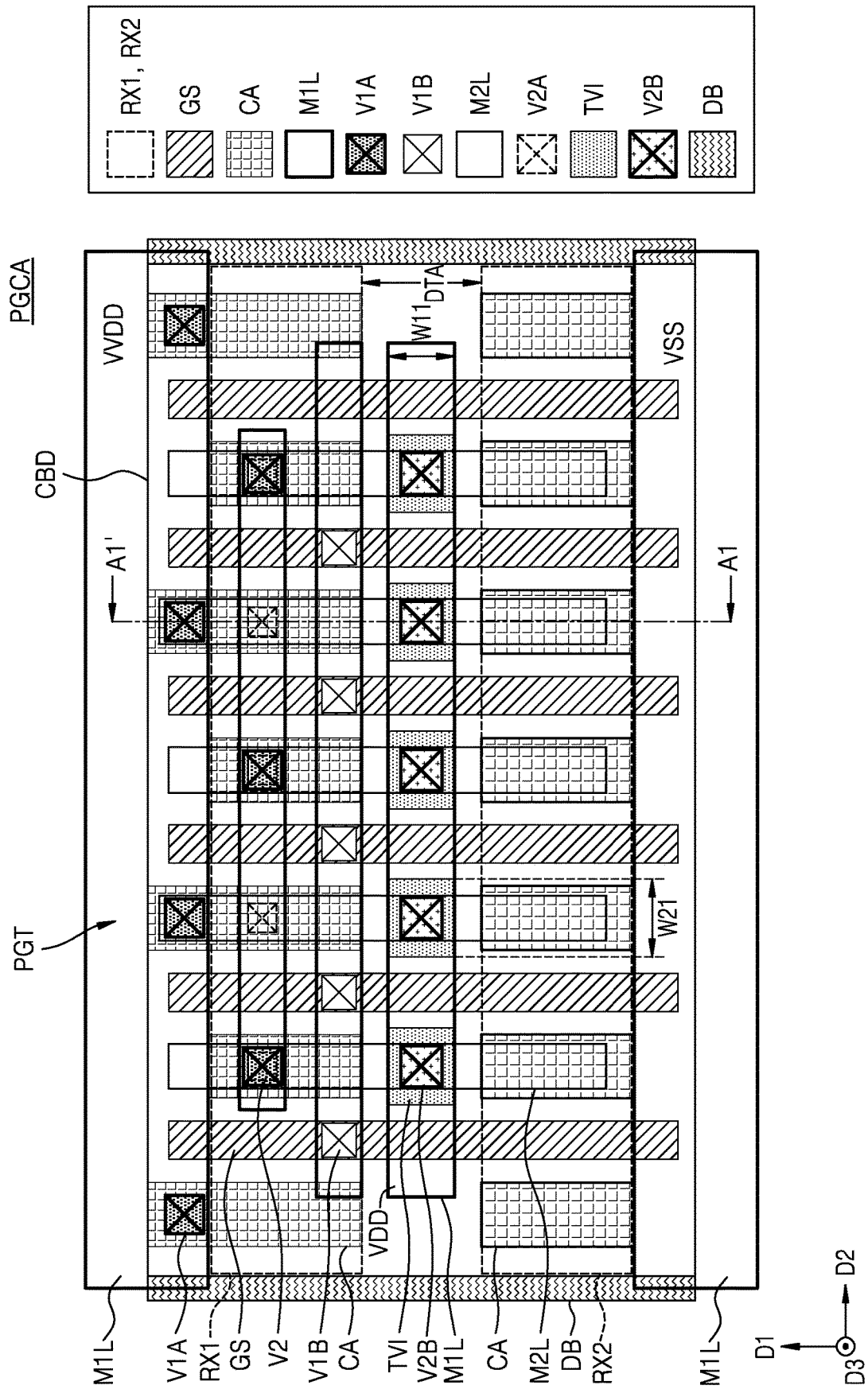
FIG. 7 is a layout diagram of a power gating cell according to example embodiments.
Figure 8:
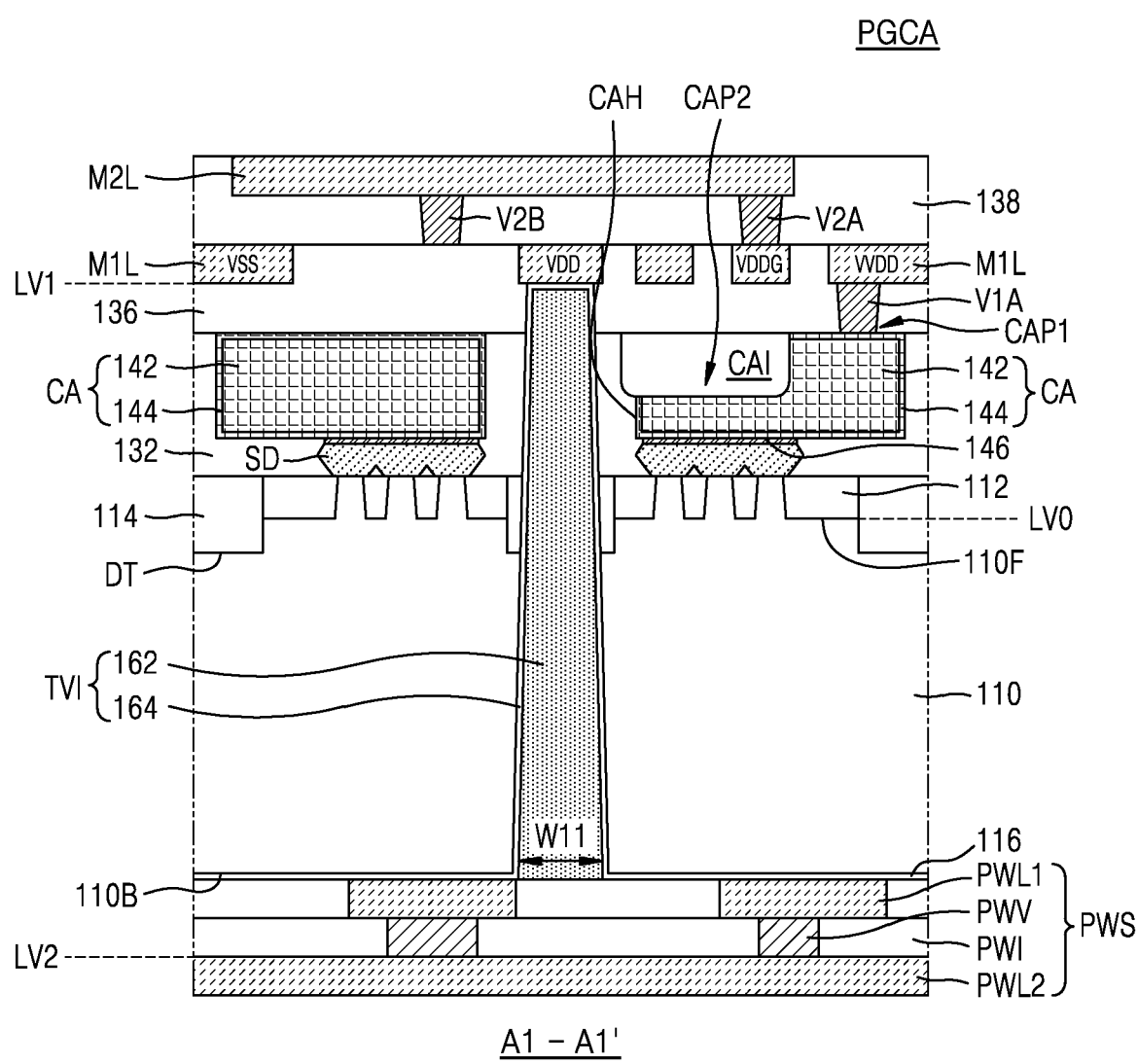
FIG. 8 is a cross-sectional view of the power gating cell, taken along line A1-A1' of FIG. 7.

FIG. 7 is a layout diagram of a power-gating cell PGCA according to example embodiments. FIG. 8 is a cross-sectional view of the power gating cell PGCA, taken along line A1-A1' of FIG. 7.

Referring to FIGS. 7 and 8, the gate structure GS may extend in the first horizontal direction D1 across the first active area RX1 and the second active area RX2, and the source/drain contact CA may be between two adjacent gate structures GS on the second active area RX2. The power-gating cell PGCA may be a single height cell, and the second active area RX2 may be an area in which a dummy transistor is formed.

The power line VDD may be in a deep trench area DTA between the first active area RX1 and the second active area RX2, and a plurality of through vias TVI may be formed in the deep trench area DTA. Each through via TVI may be between the two adjacent gate structures GS in the deep trench area DTA. FIG. 7 shows that five through vias TVI are arranged apart from each other in the second horizontal direction D2, but the number of through vias TVI may vary according to a size of the power-gating cell PGCA.

In example embodiments, the through via TVI may have the first width W11 in the first horizontal direction D1 and the first length W21 in the second horizontal direction D2, and the first width W11 and the first length W21 may range from about 10 nm to about 500 nm, but are not limited thereto. A ratio of the first length W21 to the first width W11 of the through via TVI may be about 0.2 to about 5, but is not limited thereto.

Figure 9:
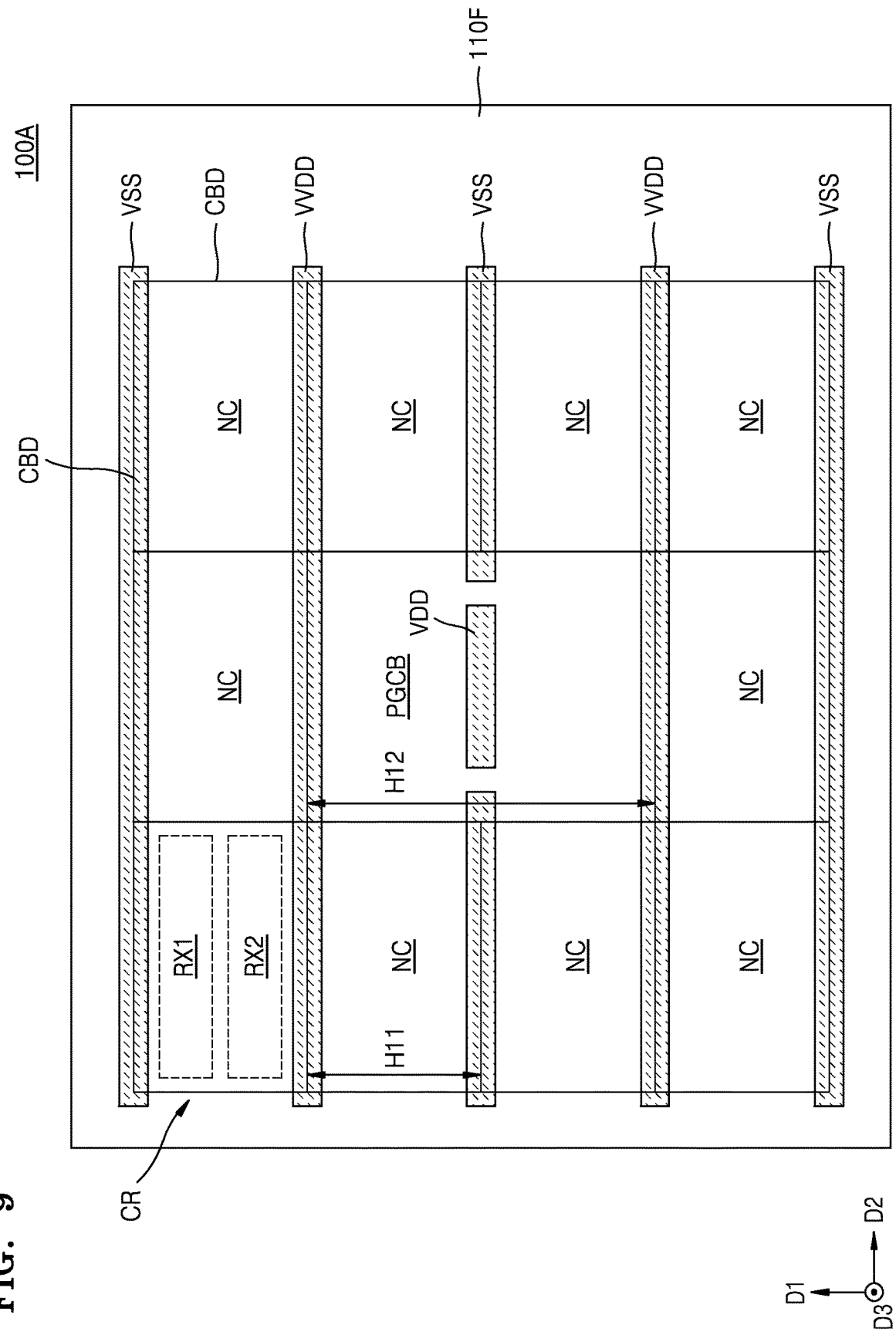
FIG. 9 is a layout diagram of an integrated circuit device according to example embodiments.
Figure 10:
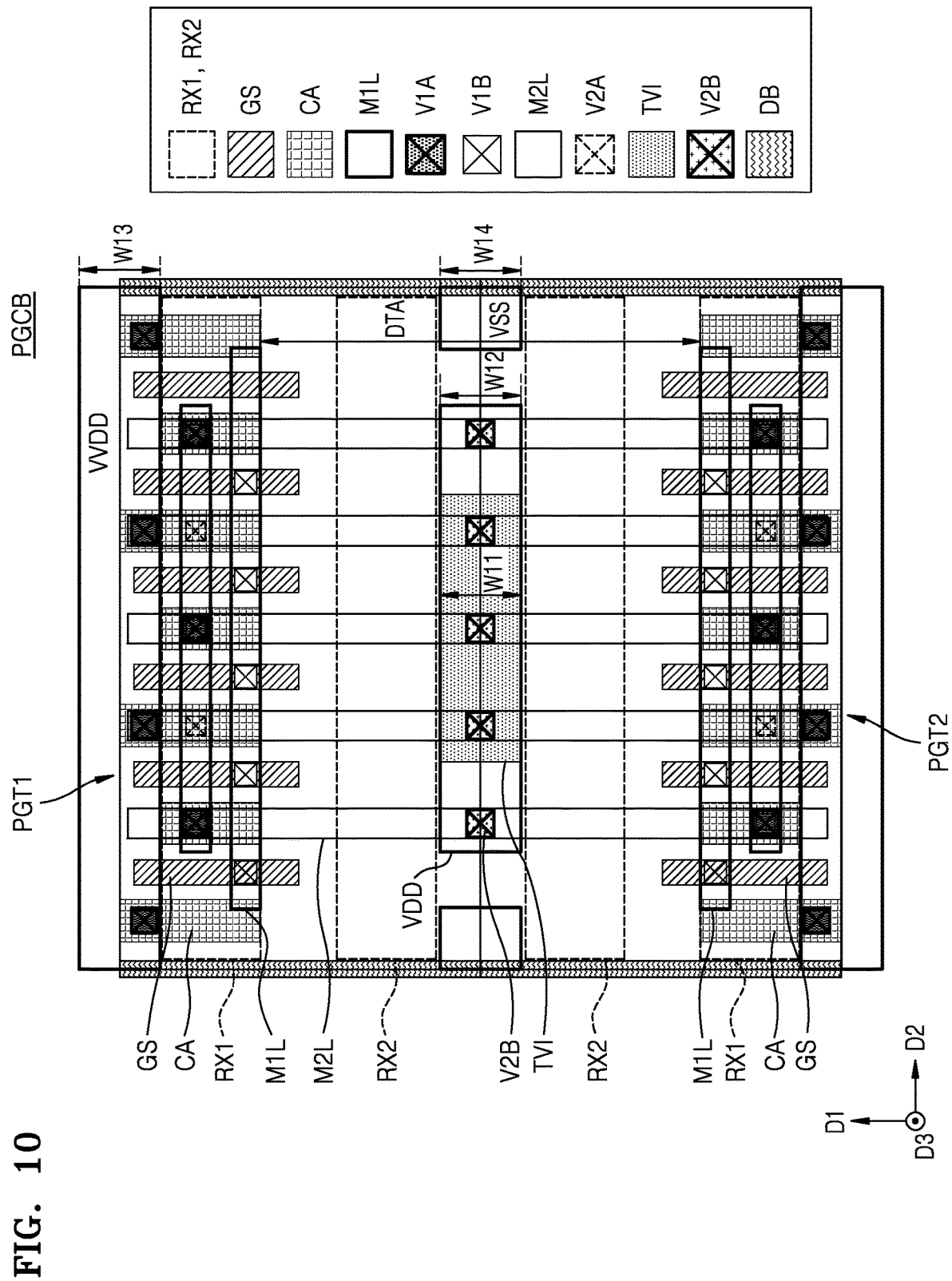
FIG. 10 is a layout diagram of a power gating cell of FIG. 9.

FIG. 9 is a layout diagram of an integrated circuit device 100A according to example embodiments. FIG. 10 is a layout diagram of a power-gating cell PGCB of FIG. 9.

Referring to FIGS. 9 and 10, the normal cell NC, which is a single height cell, may have the first height H11 in the first horizontal direction D1. The power-gating cell PGCB, which may be a double height cell, may have the second height H12 in the first horizontal direction D1, and the second height H12 may be twice the first height H11.

The power gating cell PGCB may include a first sleep control transistor PGT1 and a second sleep control transistor PGT2 that are apart from each other in the first horizontal direction D1. The first sleep control transistor PGT1 and the second sleep control transistor PGT2 have a mirror-symmetric structure and may be arranged in the first active areas RX1 at the top and bottom of the power gating cell PGCB, and the through via TVI and the power line VDD may be arranged in the second active area RX2 in a central portion of the power gating cell PGCB.

As illustrated in FIG. 4, the fin-type active area FA may be removed and the deep trench isolation layer 114 may be arranged in the second active area RX2. For example, when the deep trench isolation layer 114 surrounds the through via TVI in a plan view, electrical insulation between the through via TVI and the first active area RX1 may be ensured. However, example embodiments are not limited thereto, and as described with reference to FIG. 7, the fin-type active area FA may remain in the second active area RX2.

The power line VDD in the power gating cell PGCB may be arranged to be apart from the ground line VSS crossing the normal cell NC adjacent thereto in a second horizontal direction D2, and may be arranged on a straight line with the ground line VSS. For example, the ground line VSS, the power line VDD, and the ground line VSS extending in the second horizontal direction D2 may be sequentially arranged in the second horizontal direction D2. In example embodiments, the power line VDD may have the second width W12 in the first horizontal direction D1, the virtual power line VVDD may have the third width W13 in the first horizontal direction D1, the ground line VSS may have a fourth width W14 in the first horizontal direction D1, and the second to fourth widths W12, W13, and W14 may range from about 50 nm to about 600 nm. The second width W12 of the power line VDD may be the same as the fourth width W14 of the ground line VSS, but is not limited thereto.

FIG. 9 shows that the power line VDD is spaced apart from the ground line VSS in the second horizontal direction D2 and is arranged on a straight line with the ground line VSS. However, in other example embodiments, the power line VDD may be apart from the virtual power line VVDD in the second horizontal direction D2 and may be arranged on a straight line with the virtual power line VVDD. For example, the virtual power line VVDD, the power line VDD, and the virtual power line VVDD extending in the second horizontal direction D2 may be sequentially arranged in the second horizontal direction D2.

Figure 11:
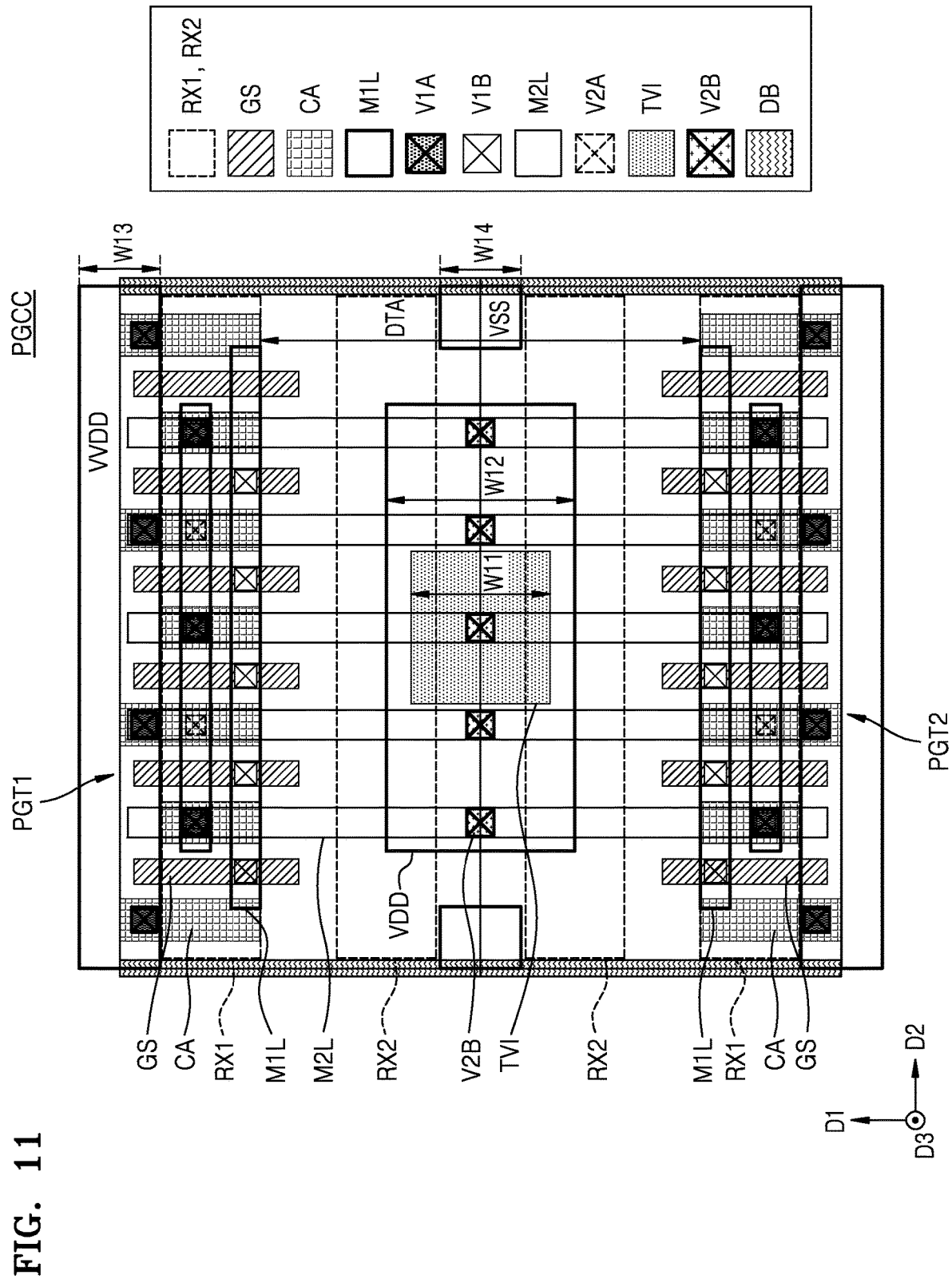
FIG. 11 is a layout diagram of a power gating cell according to example embodiments.

FIG. 11 is a layout diagram of a power-gating cell PGCC according to example embodiments.

Referring to FIG. 11, the second width W12 of the power line VDD may be greater than the fourth width W14 of the ground line VSS. For example, the second width W12 of the power line VDD may be 1.5 to 5 times the fourth width W14 of the ground line VSS, but is not limited thereto. In addition, the first width W11 of the through via TVI may be greater than the fourth width W14 of the ground line VSS, and may be, for example, 1.5 to 5 times the fourth width W14 of the ground line VSS.

Figure 12:
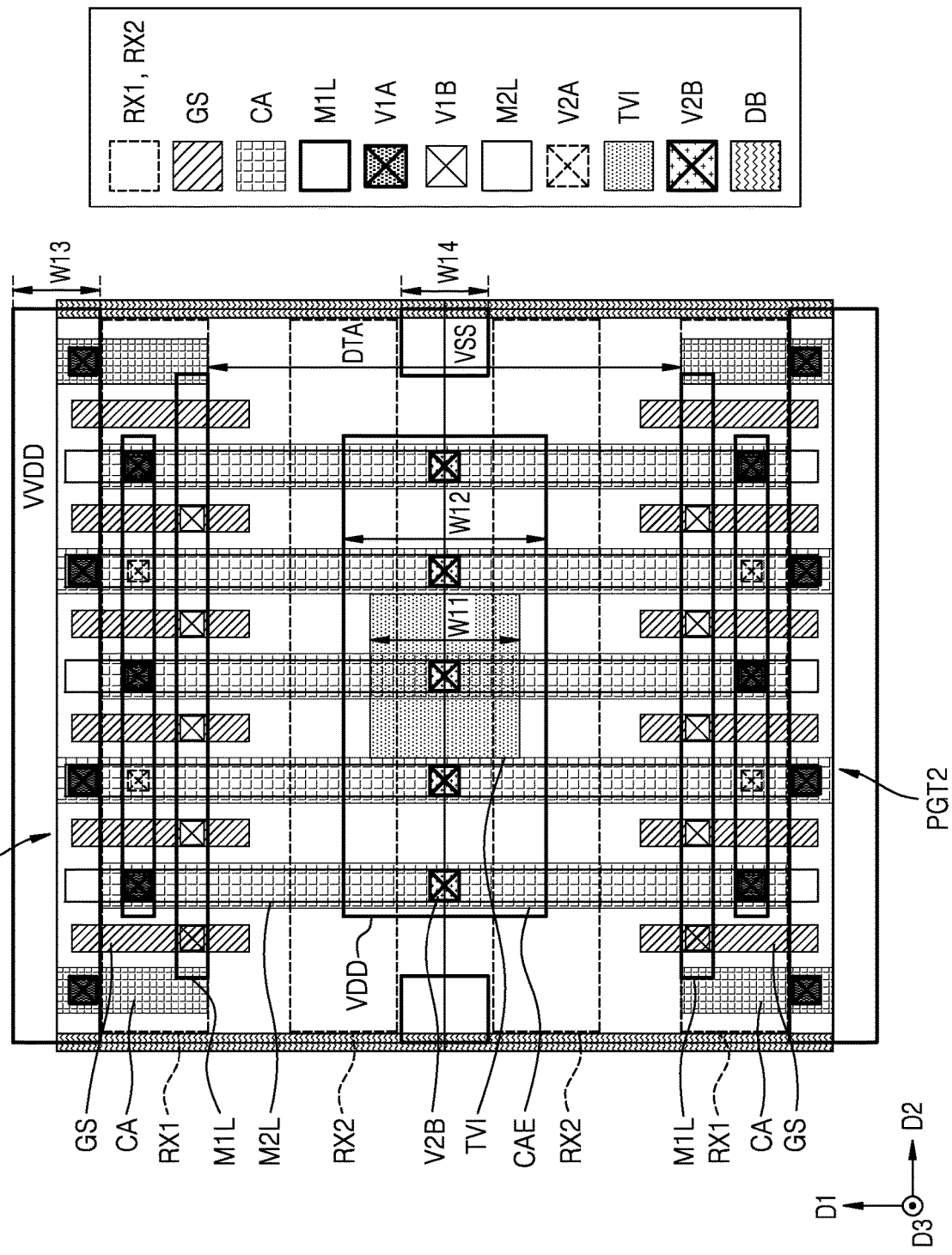
FIG. 12 is a layout diagram of a power gating cell according to example embodiments.

FIG. 12 is a layout diagram of a power-gating cell PGCD according to example embodiments.

Referring to FIG. 12, the plurality of source/drain contacts CA may include an extended source/drain contact CAE, and the extended source/drain contact CAE may extend in the first horizontal direction D1 and be shared by the first sleep control transistor PGT1 and the second sleep control transistor PGT2. The extended source/drain contact CAE may vertically overlap the power line VDD.

Figure 13:
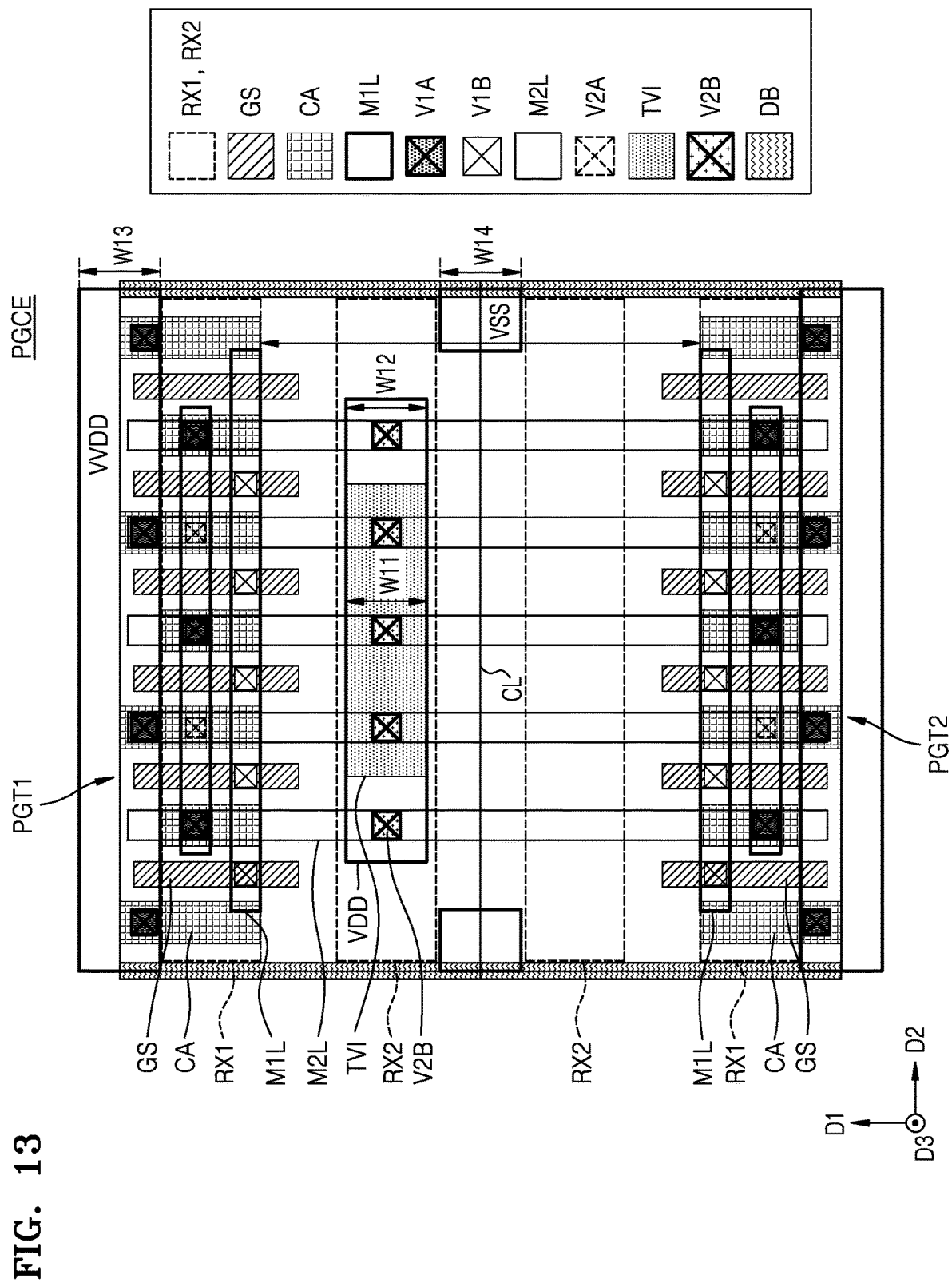
FIG. 13 is a layout diagram of a power gating cell according to example embodiments.

FIG. 13 is a layout diagram of a power-gating cell PGCE according to example embodiments.

Referring to FIG. 13, the power line VDD and the through via TVI may be arranged to be offset from a center line CL of the power gating cell PGCE in the first horizontal direction D1. Accordingly, the power line VDD extends in the second horizontal direction D2 parallel to the ground line VSS, but is offset or apart in the first horizontal direction D1. In other words, an extension line of the power line VDD and an extension line of the ground line VSS may not coincide with each other.

Figure 14:
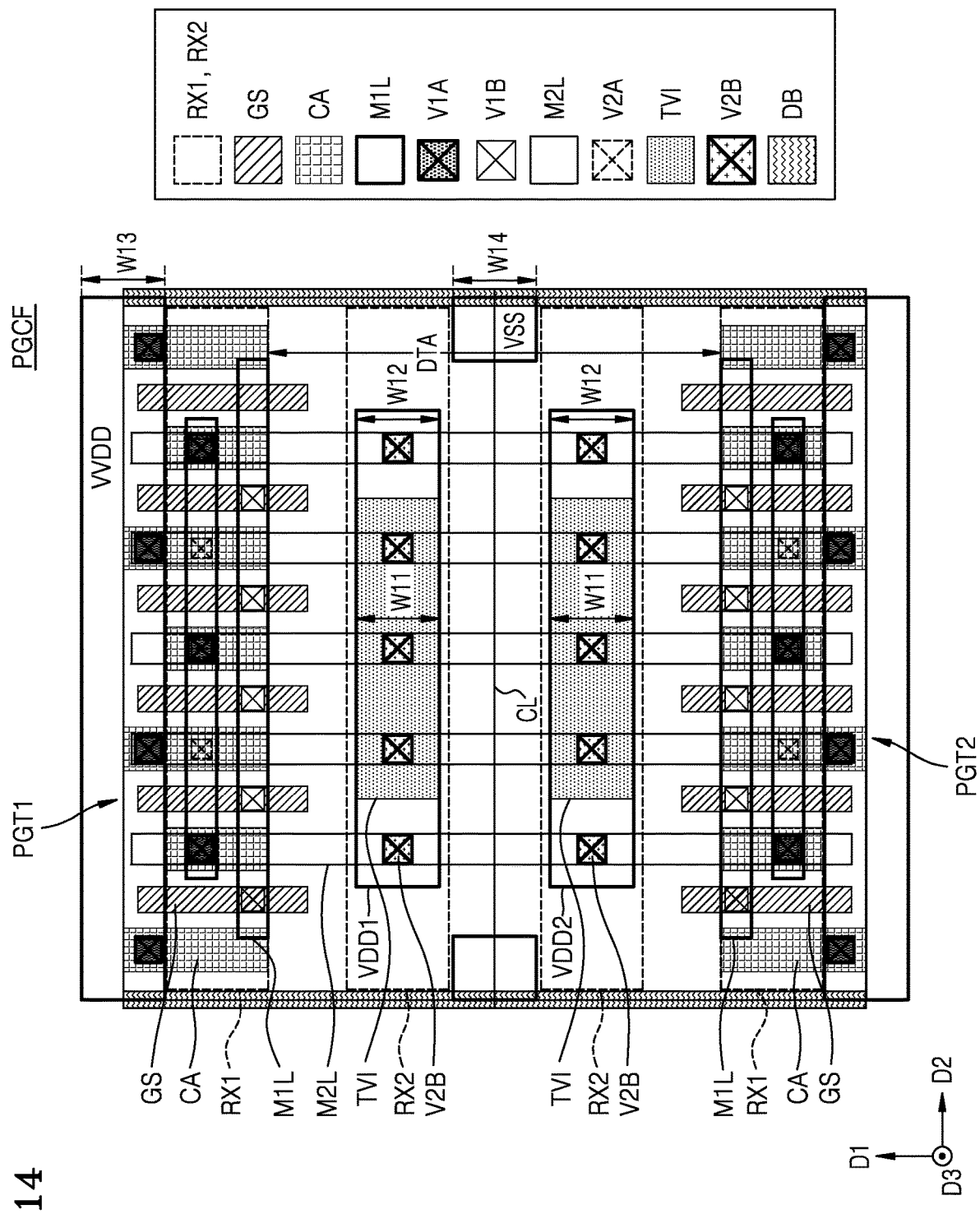
FIG. 14 is a layout diagram of a power gating cell according to example embodiments.

FIG. 14 is a layout diagram of a power-gating cell PGCF according to example embodiments.

Referring to FIG. 14, a first power line VDD1 and a second power line VDD2 may be symmetrically arranged with respect to the center line CL of the power-gating cell PGCF. For example, the first power line VDD1 may be arranged to be spaced upward in the first horizontal direction D1 with respect to the center line CL of the power gating cell PGCF, and the second power line VDD2 may be arranged to be spaced downward in the first horizontal direction D1 with respect to the center line CL of the power gating cell PGCF.

Figure 15:
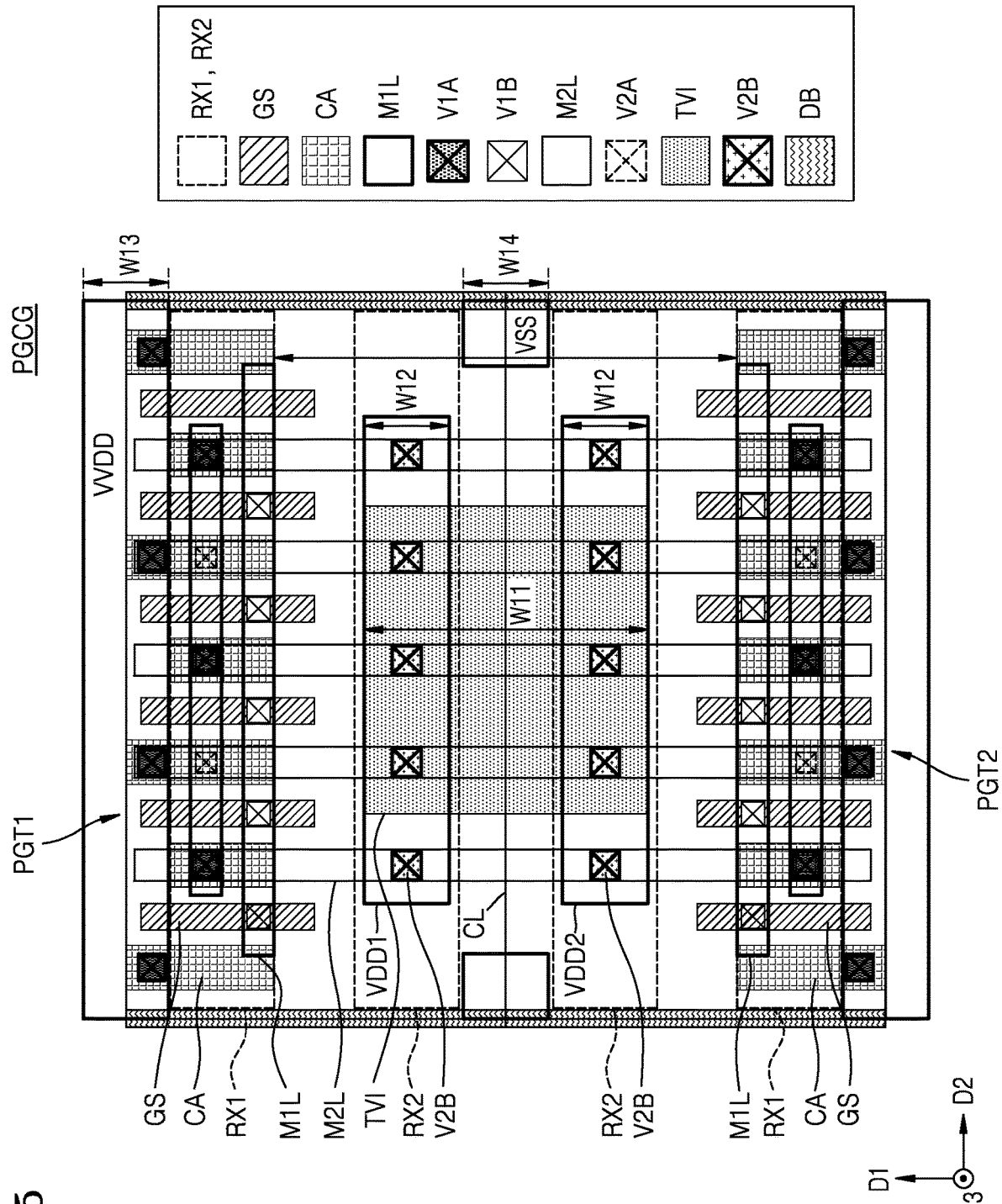
FIG. 15 is a layout diagram of a power gating cell according to example embodiments.

FIG. 15 is a layout diagram of a power-gating cell PGCG according to example embodiments.

Referring to FIG. 15, the first power line VDD1 and the second power line VDD2 are arranged to be apart from each other based on the center line CL of the power gating cell PGCG, and the through via TVI may be arranged to vertically overlap both the first power line VDD1 and the second power line VDD2. The through via TVI may have the first width W11 in the first horizontal direction D1, and the first width W11 may range from about 100 nm to about 900 nm. The first width W11 may be about 2.5 to 10 times the second width W12 of the first and second power lines VDD1 and VDD2, but is not limited thereto.

Figure 16:
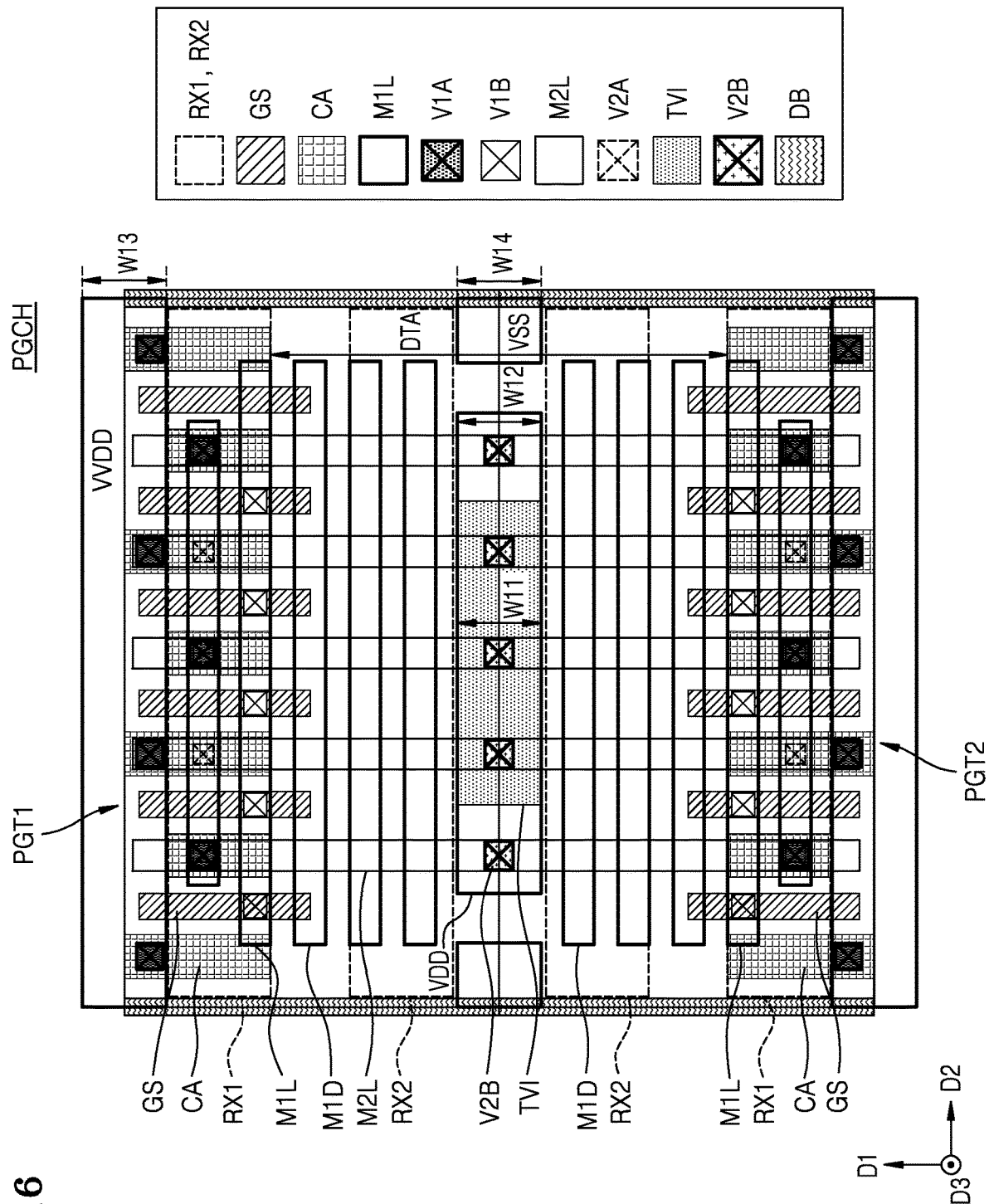
FIG. 16 is a layout diagram of a power gating cell according to example embodiments.

FIG. 16 is a layout diagram of a power-gating cell PGCH according to example embodiments.

Referring to FIG. 16, the power-gating cell PGCH may include a plurality of dummy wiring lines M1D arranged between the power line VDD and the plurality of first wiring layers M1L. The plurality of dummy wiring lines M1D may be arranged at the same vertical level as that of the plurality of first wiring layers M1L (e.g., LV1) (see FIG. 4), and may be idle wires in which no electrical signal is provided. For example, the plurality of dummy wiring lines M1D may be arranged at substantially the same interval between the power line VDD and the plurality of first wiring layers M1L. FIG. 16 illustrates that three dummy wiring lines M1D are arranged between the power line VDD and the plurality of first wiring layers M1L as an example, but the number of dummy wiring lines M1D may vary.

Figure 17:
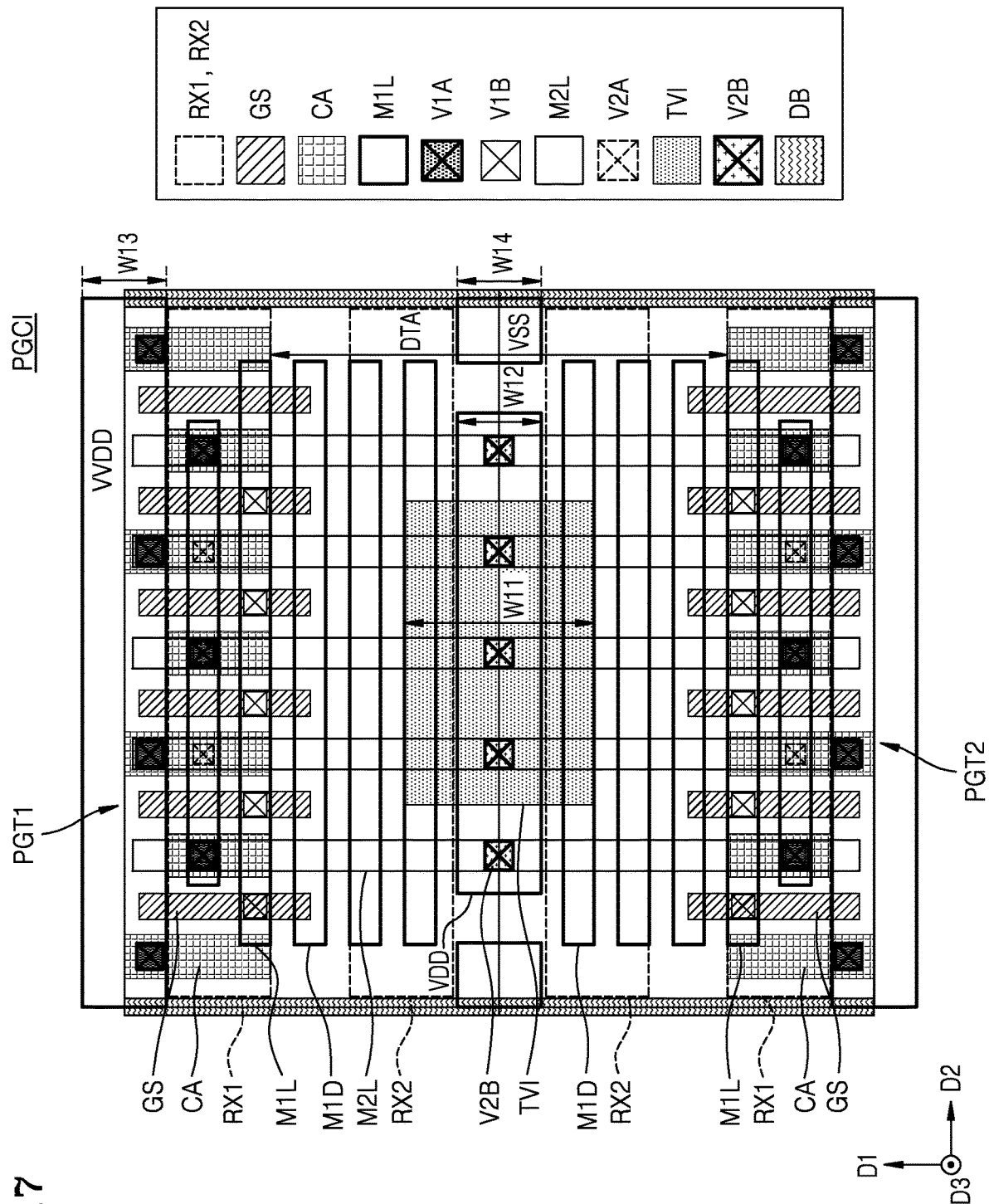
FIG. 17 is a layout diagram of a power gating cell according to example embodiments.

FIG. 17 is a layout diagram of a power-gating cell PGCI according to example embodiments.

Referring to FIG. 17, the power gating cell PGCI may include the plurality of dummy wiring lines M1D arranged between the power line VDD and the plurality of first wiring layers M1L, and the through via TVI may vertically overlap at least one of the plurality of dummy wiring lines M1D.

For example, FIG. 17 exemplarily shows that three dummy wiring lines M1D are arranged between the power line VDD and the plurality of first wiring layers M1L, and the through via TVI vertically overlaps a dummy wiring line M1D closest to the power line VDD on an upper side of the power line VDD (e.g., in a portion closer to the first sleep control transistor PGT1 in a plan view of FIG. 17) and a dummy wiring line M1D closest to the power line VDD on a lower side of the power line VDD (e.g., in a portion closer to the second sleep control transistor PGT2 in a plan view of FIG. 17).

In other example embodiments, the through via TVI may vertically overlap the dummy wiring line M1D closest to the power line VDD on the upper side of the power line VDD, and may not vertically overlap the dummy wiring line M1D closest to the power line VDD on the lower side of the power line VDD. In other example embodiments, the through vias TVI may vertically overlap two dummy wiring lines M1D closest to the power line VDD on the upper side of the power line VDD and two dummy wiring lines M1D closest to the power line VDD on the lower side of the power line VDD.

Figure 18:
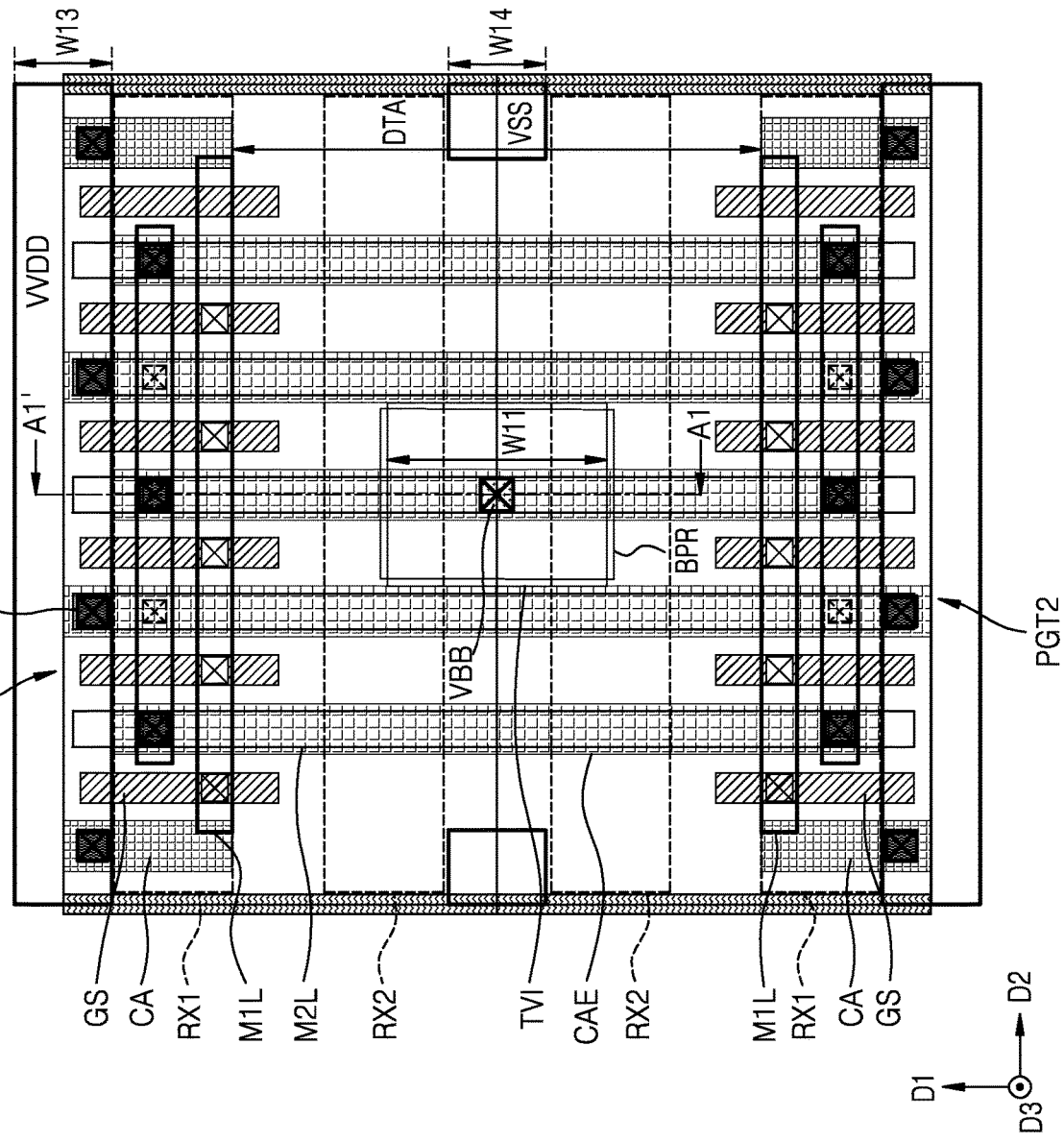
FIG. 18 is a layout diagram of a power gating cell according to example embodiments.
Figure 19:
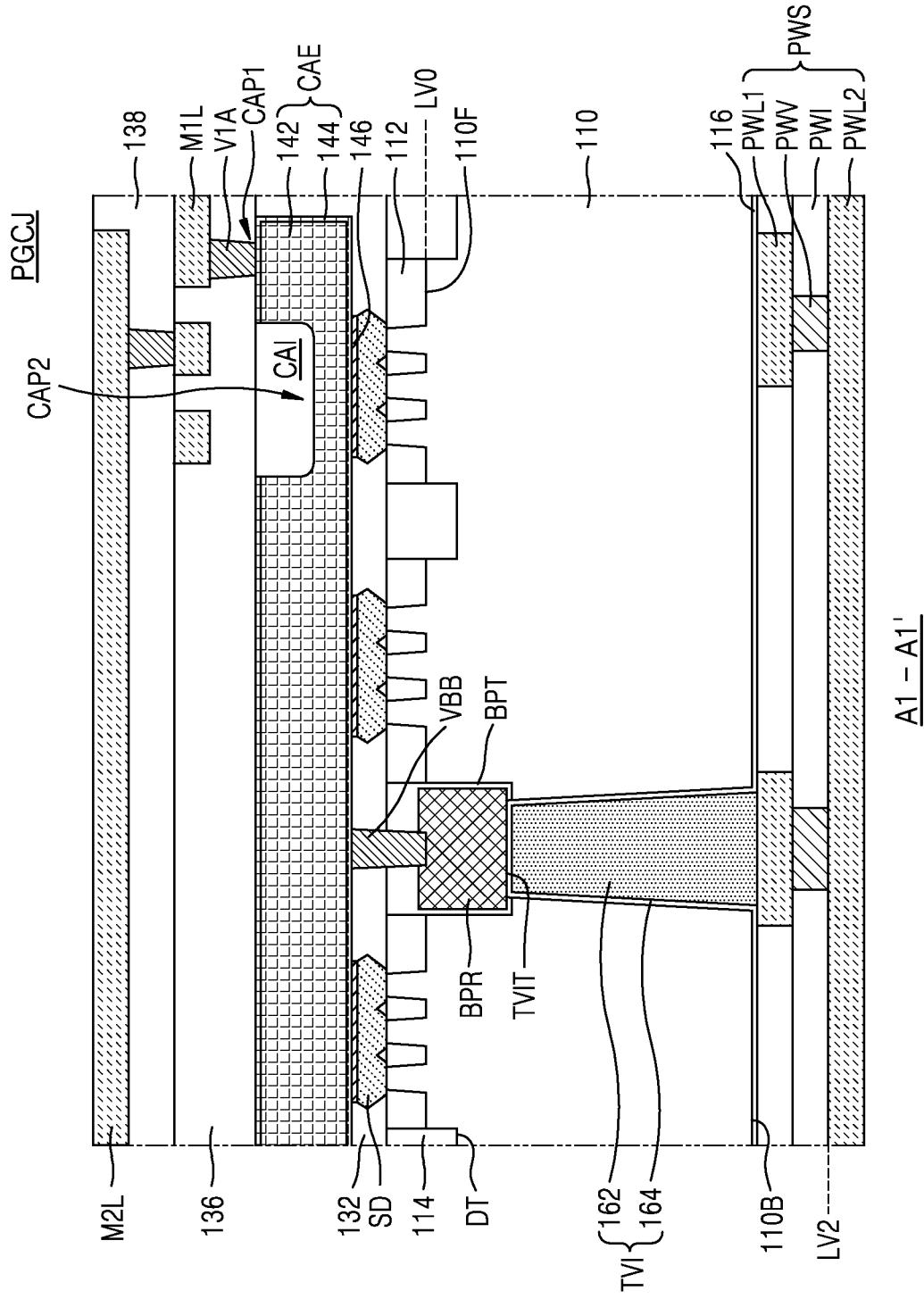
FIG. 19 is a cross-sectional view of the power gating cell, taken along line A1-A1' of FIG. 18.

FIG. 18 is a layout diagram of a power-gating cell PGCJ according to example embodiments. FIG. 19 is a cross-sectional view of the power gating cell PGCJ, taken along line A1-A1' of FIG. 18.

Referring to FIGS. 18 and 19, the power gating cell PGCJ may include an extended source/drain contact CAE extending from the first active area RX1 to the second active area RX2, and a buried power rail BPR may be between the source/drain contact CAE extending in the second active area RX2 and the through via TVI. A buried via VBB may be between the buried power rail BPR and the extended source/drain contact CAE to electrically connect the buried power rail BPR to the extended source/drain contact CAE.

A lower side of the buried power rail BPR may be arranged in a first trench BPT having a certain depth from the first surface 110F of the substrate 110, and an upper side of the buried power rail BPR may be surrounded by the device isolation layer 112 and the inter-gate insulating layer 132. An insulating liner may be further interposed between the buried power rail BPR and the device isolation layer 112 and the inter-gate insulating layer 132. The buried power rail BPR may include doped polysilicon, a metal, a conductive metal nitride, a conductive metal carbide, a conductive metal silicide, or a combination thereof.

As shown in FIG. 19, the end TVIT of the through via TVI may be covered by a bottom surface of the buried power rail BPR. As the buried power rail BPR is arranged between the through via TVI and the extended source/drain contact CAE, a height of the through via TVI in a vertical direction D3 may be relatively reduced.

Figure 20:
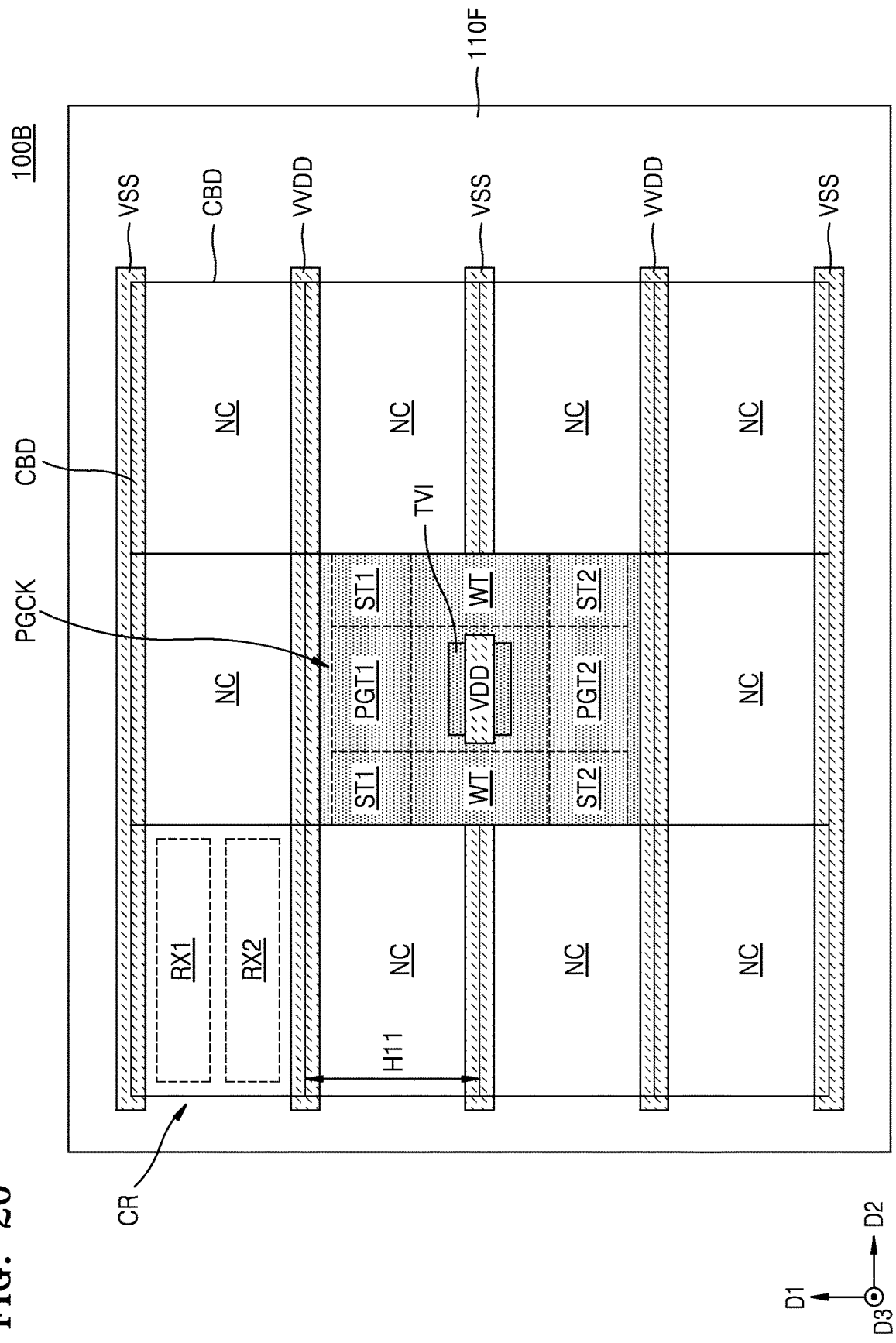
FIG. 20 is a layout diagram of an integrated circuit device according to example embodiments.
Figure 21:
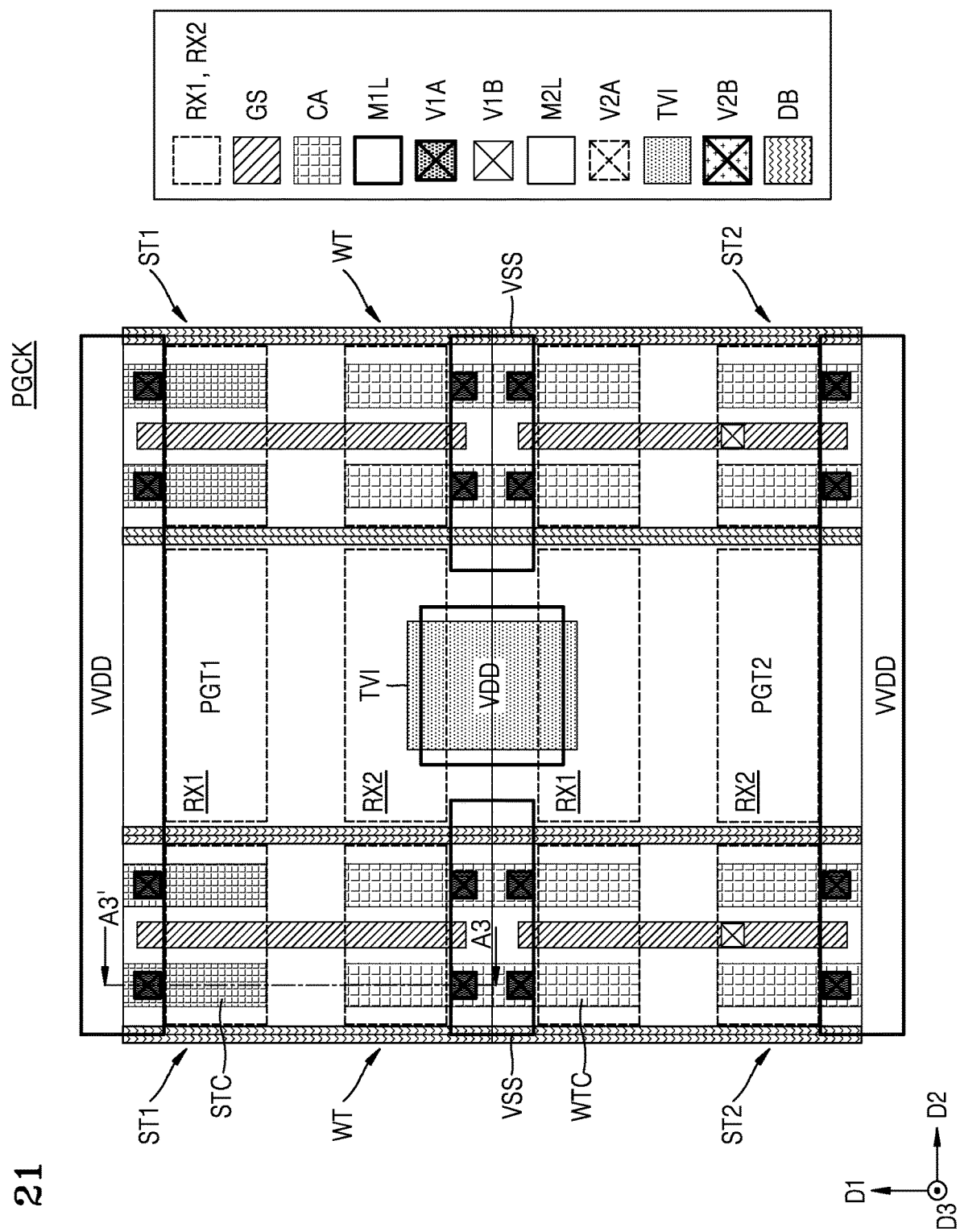
FIG. 21 is a layout diagram of a power gating cell of FIG. 20.
Figure 22:
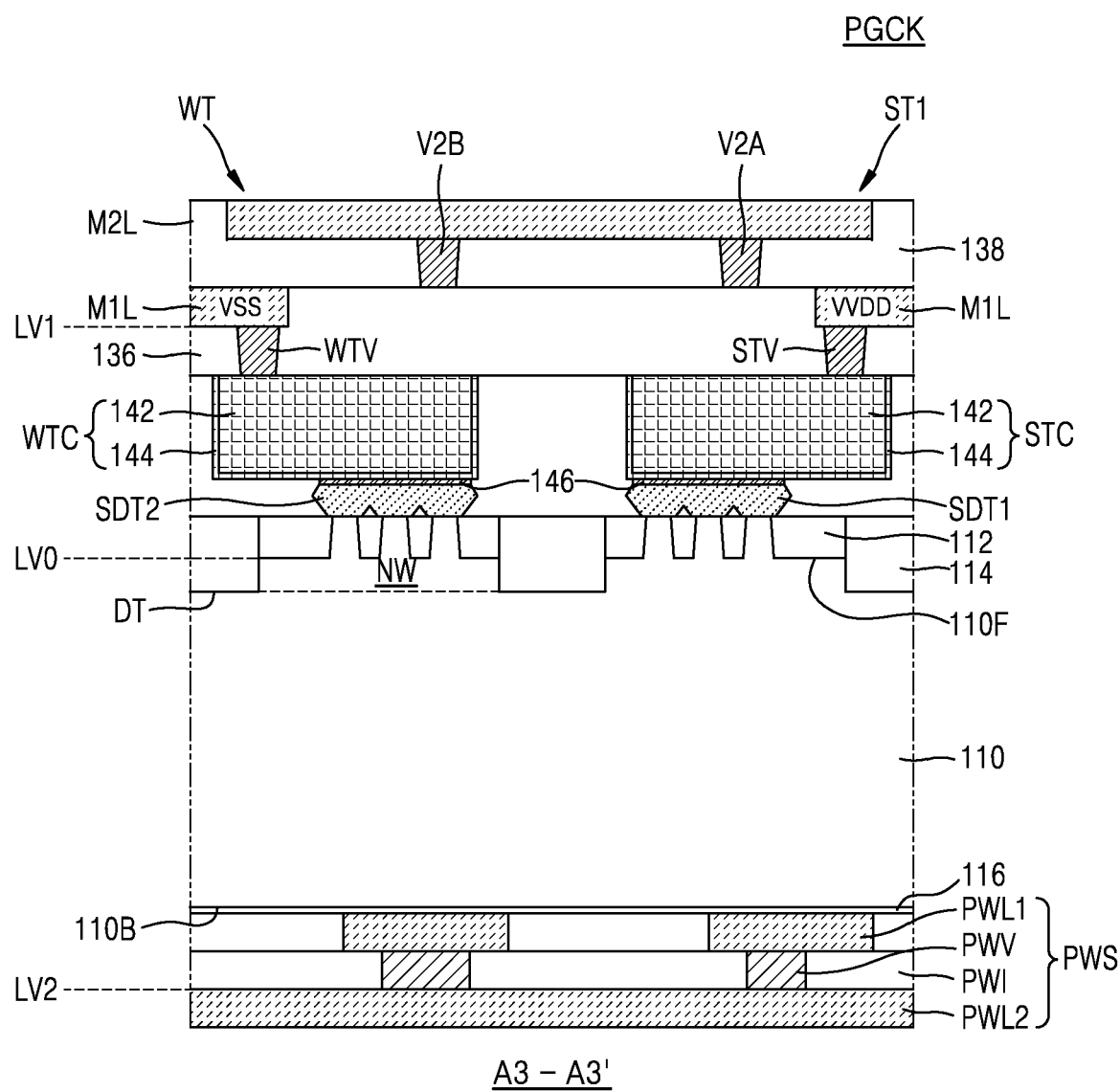
FIG. 22 is a cross-sectional view of the power gating cell, taken along line A3-A3' of FIG. 21.

FIG. 20 is a layout diagram of an integrated circuit device 100B according to example embodiments. FIG. 21 is a layout diagram of a power-gating cell PGCK of FIG. 20. FIG. 22 is a cross-sectional view of the power gating cell PGCK, taken along line A3-A3' of FIG. 21.

Referring to FIGS. 20 to 22, the power gating cell PGCK may further include a first sub tap area ST1 arranged in the first active areas RX1 on both sides of the first sleep control transistor PGT1, a well tap area WT arranged in the second active area RX2 on both sides of the through via TVI, and a second sub tap area ST2 arranged in the first active area RX1 on both sides of the second sleep control transistor PGT2.

The first sub tap area ST1 and the second sub tap area ST2 may include a first conductive diffusion area SDT1 and a sub tap contact STC connected to the first conductive diffusion area SDT1. For example, the first conductive diffusion area SDT1 may be an area in which P type impurities are included. In example embodiments, the first conductive diffusion area SDT1 may have a shape similar to the source/drain area SD formed on the fin-type active area FA (see FIG. 4), and the sub tap contact STC may have a shape similar to that of the source/drain contact CA (see FIG. 4). The sub tap contact STC and the first conductive diffusion area SDT1 may be connected to the virtual power line VVDD through a sub tap via STV.

The well tap area WT may include a second conductive well area NW, a second conductive diffusion area SDT2, and a well tap contact WTC connected to the second conductive diffusion area SDT2. For example, the second conductive diffusion area SDT2 may be an area in which N type impurities are included. The second conductive well area NW may refer to an area doped with an N-type impurity on a portion of an upper side of the substrate 110. In example embodiments, the second conductive diffusion area SDT2 may have a shape similar to the source/drain area SD formed on the fin-type active area FA (see FIG. 4), and the well tap contact WTC may have a shape similar to that of the source/drain contact CA (see FIG. 4). The well tap contact WTC and the second conductive diffusion area SDT2 may be connected to the ground line VSS through a well tap via WTV.

The well tap area WT and the sub tap areas ST1 and ST2 may function as buffer areas that reduce an electrical influence of the power-gating cell PGCK on the normal cell NC adjacent thereto.

Figure 23:
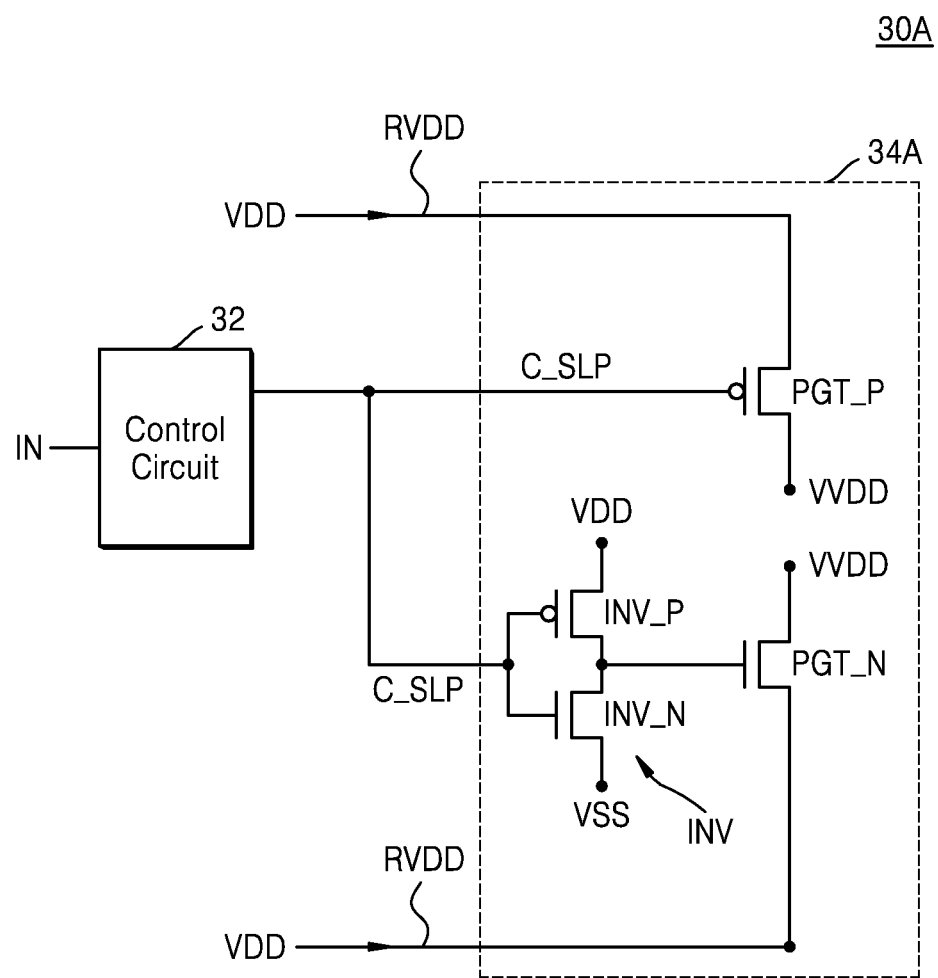
FIG. 23 is a block diagram of a power gating circuit according to example embodiments.

FIG. 23 is a block diagram of a power gating circuit 30A according to example embodiments.

Referring to FIG. 23, the power gating circuit 30A may include a sleep control transistor unit 34A connected between the first power line RVDD and the first virtual power line VVDD, and the control circuit 32 providing the switching signals C_SLP to the sleep control transistor unit 34A. In example embodiments, the sleep control transistor unit 34A may include a first sleep control transistor PGT_P, a second sleep control transistor PGT_N, and an inverter INV. The first sleep control transistor PGT_P may be a PMOS transistor, and the second sleep control transistor PGT_N may be an NMOS transistor. A drain terminal of a PMOS transistor INV_P and an NMOS transistor INV_N included in the inverter INV may be connected to a gate of the second sleep control transistor PGT_N.

For example, in a power-on mode, the control circuit 32 may generate the switching signal C_SLP at a logic low level for turning on the sleep control transistor unit 34A, and the switching signal C_SLP may be applied to the PMOS transistor INV_P, the NMOS transistor INV_N, and the first sleep control transistor PGT_P of the inverter INV, thereby providing the first virtual power line VVDD to the logic circuit 20 (see FIG. 1) from the first sleep control transistor PGT_P and the second sleep control transistor PGT_N. In a power-off mode, the control circuit 32 may generate the switching signal C_SLP at a logic high level for turning off the sleep control transistor unit 34A, and the sleep control transistor unit 34A may be turned off by the switching signal C_SLP and the first virtual power line VVDD may be cut off from the first power line RVDD and floated.

According to example embodiments, as the power gating circuit 30A further includes the second sleep control transistor PGT_N, an integrated circuit device including the power gating circuit 30A may perform a low-power operation.

Figure 24:
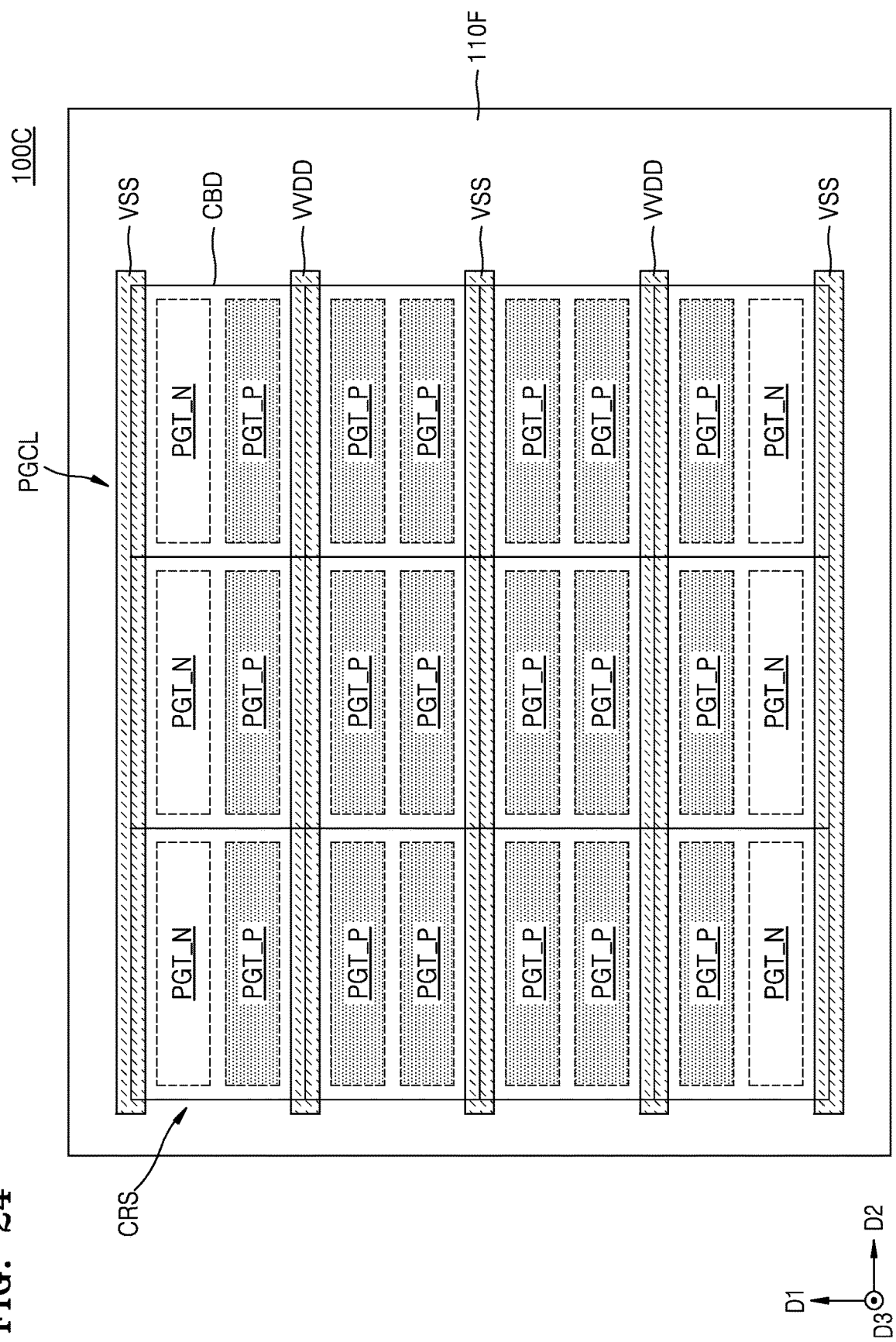
FIG. 24 is a layout diagram of an integrated circuit device according to example embodiments.

FIG. 24 is a layout diagram of an integrated circuit device 100C according to example embodiments.

Referring to FIG. 24, the integrated circuit device 100C may include a power-gating cell PGCL, and the power-gating cell PGCL may be a quadruple height cell. For example, the power gating cell PGCL may include a plurality of sub-cell areas CRS, and four sub-cell areas CRS may be sequentially arranged in the first horizontal direction D1.

The first sleep control transistor PGT_P may be arranged in a center area of the power-gating cell PGCL, and the second sleep control transistors PGT_N may be arranged at both ends of the power-gating cell PGCL in the first horizontal direction D1.

In example embodiments, an inverter may be further arranged in some sub-cell areas CRS, and the inverter may be electrically connected to the first and second sleep control transistors PGT_P and PGT_N to implement the power gating circuit 30A illustrated in FIG. 23.

Figure 25:
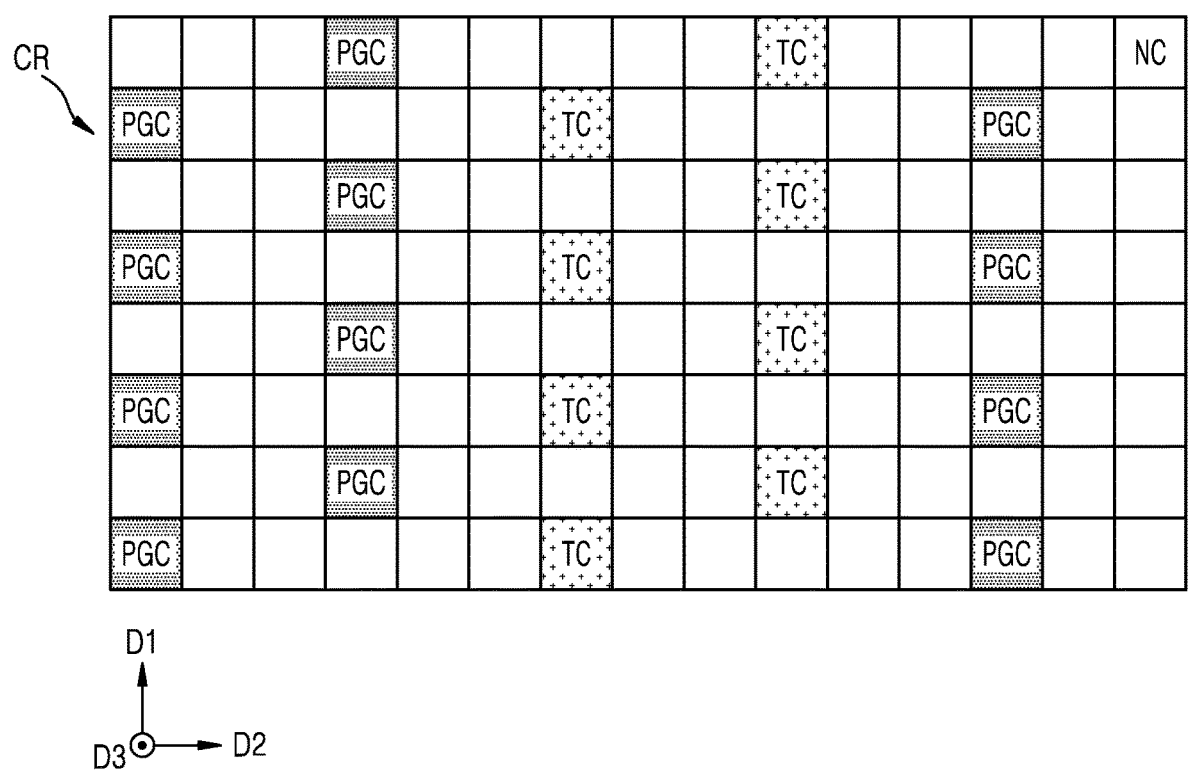
FIG. 25 is a layout diagram of an integrated circuit device according to example embodiments.

FIG. 25 is a layout diagram of an integrated circuit device 200 according to example embodiments.

Referring to FIG. 25, the integrated circuit device 200 may include the plurality of cell areas CR, and the power-gating cells PGC and tap cells TC may be arranged in the plurality of cell areas CR at certain intervals. For example, the power-gating cells PGC may be the power-gating cell described with reference to FIGS. 2 to 24.

In example embodiments, the power-gating cells PGC may be arranged in the odd-numbered cell area CR or the even-numbered cell area CR in the first horizontal direction D1. In addition, the tap cells TC may be arranged in the odd-numbered cell area CR or the even-numbered cell area CR in the first horizontal direction D1. The normal cell NC may be arranged in the remaining cell areas CR except for the power-gating cells PGC and the tap cells TC.

Figure 26:
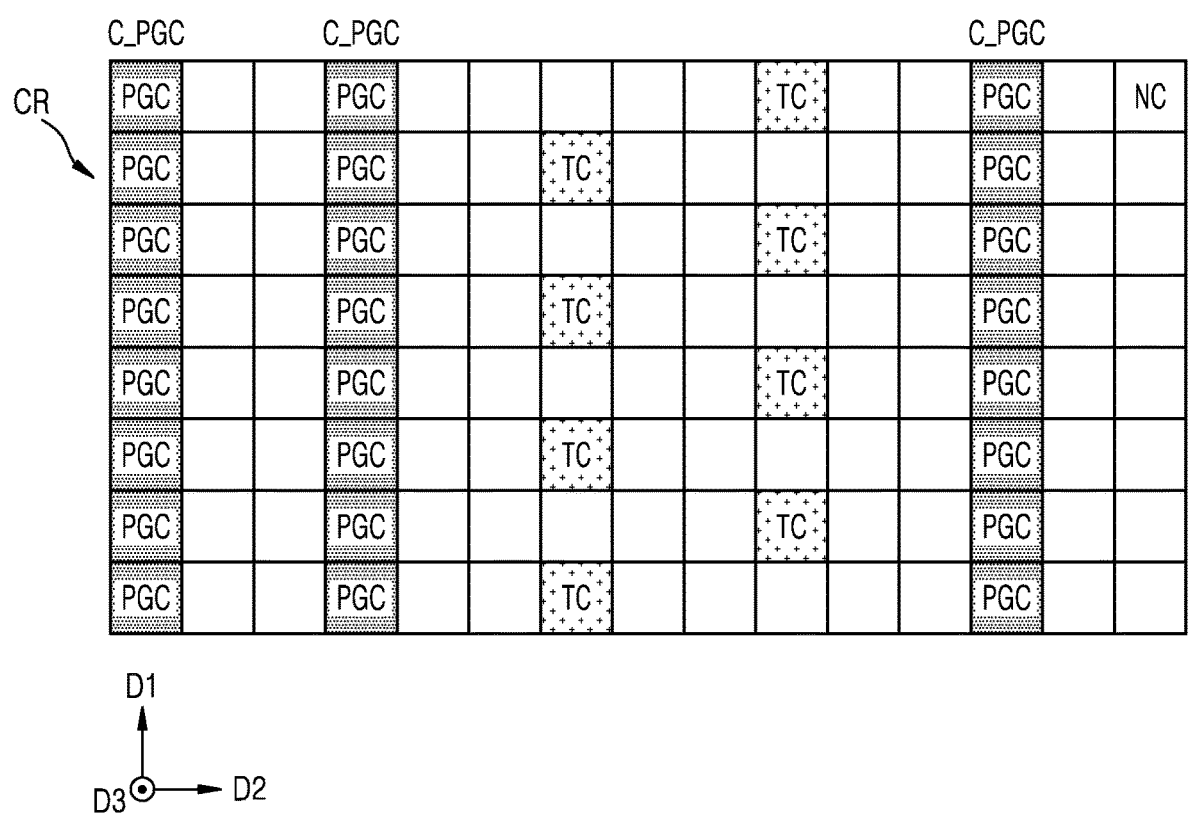
FIG. 26 is a layout diagram of an integrated circuit device according to example embodiments.

FIG. 26 is a layout diagram of an integrated circuit device 200B according to example embodiments.

Referring to FIG. 26, the power gating cells PGC may be continuously arranged in the first horizontal direction D1, and these power gating cells PGC that are consecutively arranged in the first horizontal direction D1 may form power gating cell columns C_PGC. The tap cells TC may be arranged in the odd-numbered cell areas CR or the even-numbered cell areas CR in the first horizontal direction D1. The normal cells NC may be arranged in the remaining cell areas CR except for the power gating cell columns C_PGC and the tap cells TC.

The power-gating cells PGC are exemplarily illustrated as being single height cells having the same cell height as the normal cell NC. However, power-gating cells PGC according to example embodiments may include a double height cell, a quad height cell, an octa height cell, and the like.

Figure 27A:
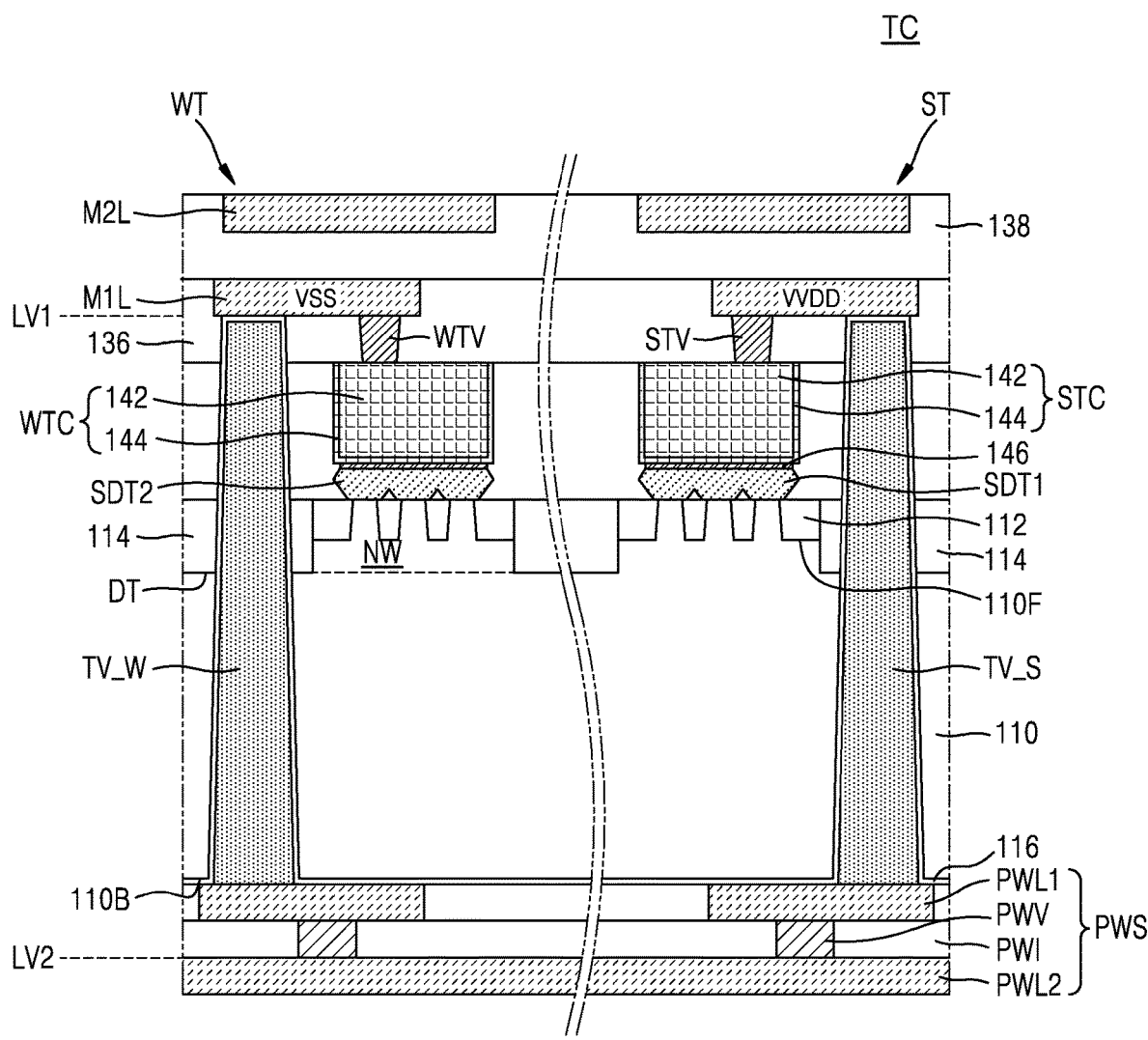
FIGS. 27A and 27B are cross-sectional views of a tap cell according to example embodiments.
Figure 27B:
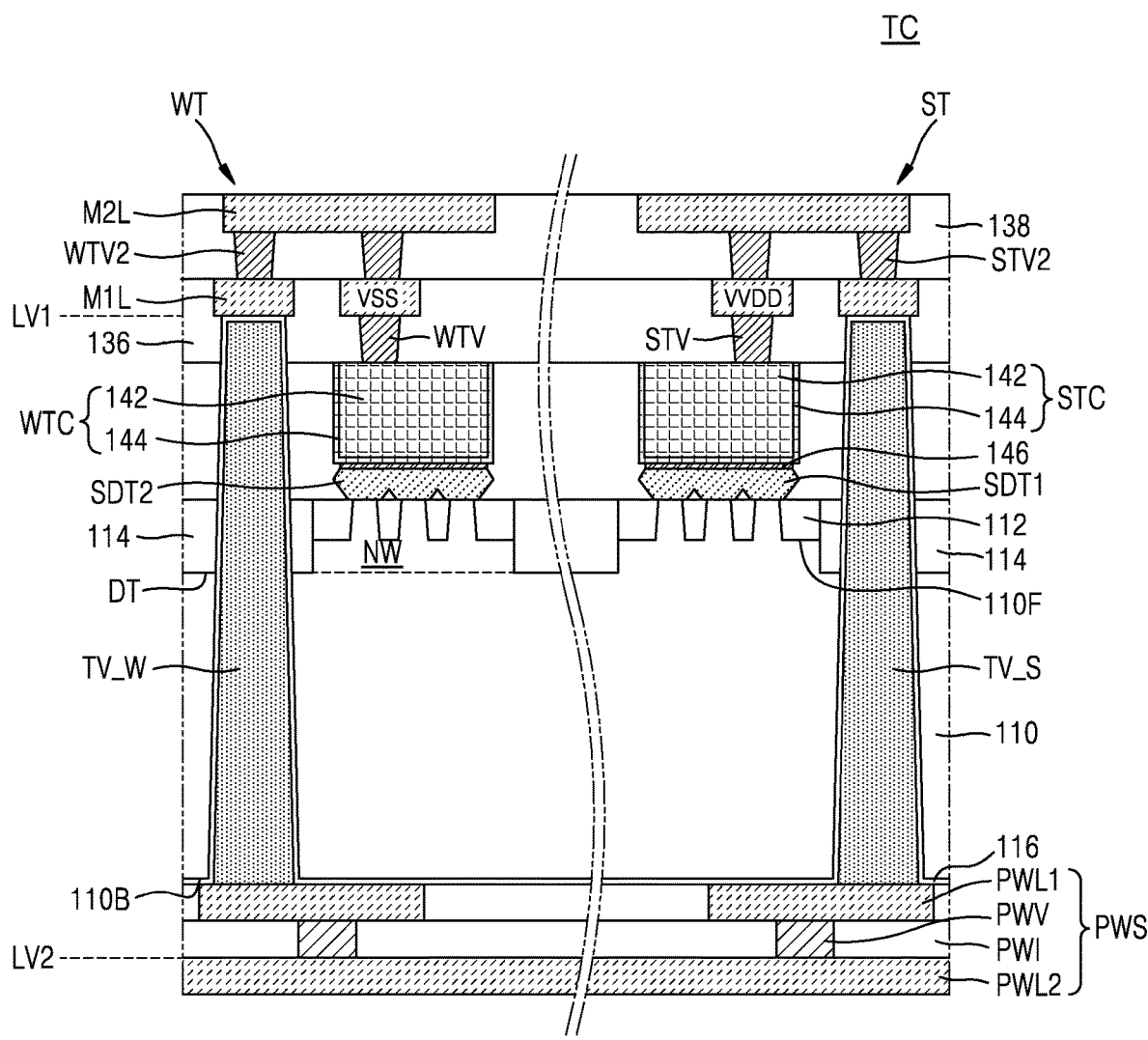

FIGS. 27A and 27B are cross-sectional views of the tap cell TC according to example embodiments.

Referring to FIG. 27A, the tap cell TC may include the well tap area WT and a sub tap area ST. The sub tap area ST may include the first conductive diffusion area SDT1, a sub tap contact STC connected to the first conductive diffusion area SDT1, and a sub tap through via TV_S penetrating the substrate 110. The sub tap contact STC and the first conductive diffusion area SDT1 may be connected to the virtual power line VVDD through a sub tap via STV, and the sub tap through via TV_S may be directly connected to the virtual power line VVDD. Power may be transmitted from the power wiring structure PWS arranged on the second surface 110B of the substrate 110 through the sub tap through via TV_S to the sub tap area ST.

The well tap area WT may include the second conductive well area NW and the second conductive diffusion area SDT2, the well tap contact WTC connected to the second conductive diffusion area SDT2, and a well tap through via TV_W penetrating the substrate 110. The well tap contact WTC and the second conductive diffusion area SDT2 may be connected to the ground line VSS through the well tap via WTV. The well tap through via TV_W may be directly connected to the ground line VSS. Power may be transmitted from the power wiring structure PWS arranged on the second surface 110B of the substrate 110 through the well tap through via TV_W to the well tap area WT.

Referring to FIG. 27B, instead of being directly connected to the virtual power line VVDD, the sub tap through via TV_S may be connected to the virtual power line VVDD through a sub tap via STV2 and the second wiring layer M2L. Instead of being directly connected to the ground line VSS, the well tap through via TV_W may be connected to the ground line VSS through a well tap via WTV2 and the second wiring layer M2L.

Figure 28:
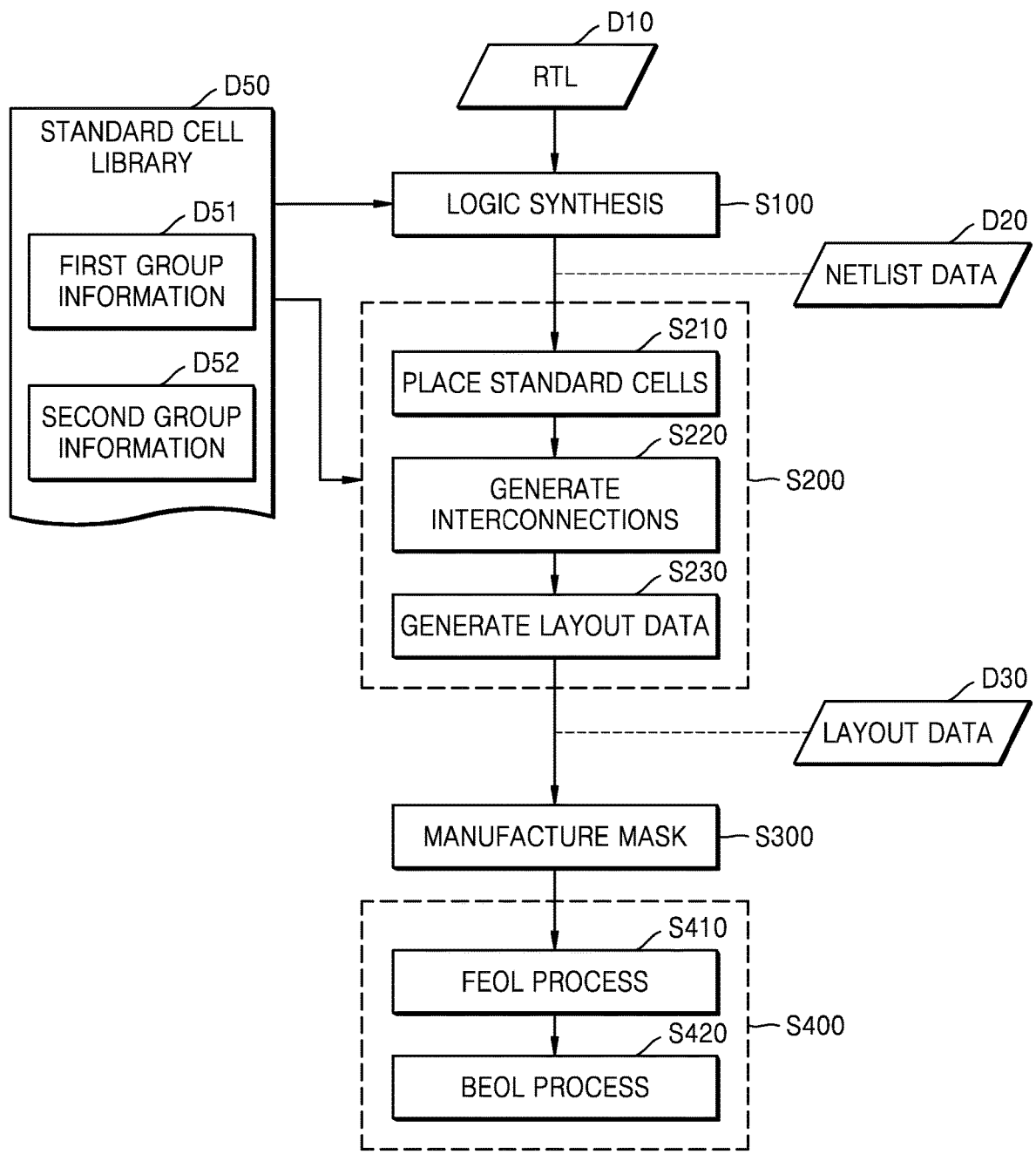
FIG. 28 is a flowchart illustrating a method of manufacturing an integrated circuit including a plurality of standard cells according to an example embodiment.

FIG. 28 is a flowchart illustrating a method of manufacturing an integrated circuit including a plurality of standard cells according to an example embodiment.

A standard cell library D50 may include information about a plurality of standard cells, such as function information, characteristic information, and layout information, and may include first group information D51 and second group information D52. The first group information D51 may include information about standard cells arranged in a normal cell, and the second group information D52 may include information about cells arranged in a power-gating cell.

Referring to FIG. 28, in operation S100, a logic synthesis operation of generating netlist data D20 from RTL data D10 may be performed. For example, a semiconductor design tool (e.g., a logic synthesis tool) may generate a bitstream or the netlist data D20 including a netlist by performing logic synthesis by referring to the standard cell library D50 from the RTL data D10 generated as a hardware description language (HDL) such as a VHSIC Hardware Description Language (VHDL) and Verilog.

In operation S200, a place & routing (P&R) operation of generating layout data D30 from the netlist data D20 may be performed. As shown in FIG. 28, the P&R operation (S200) may include a plurality of operations S210, S220, and S230.

In operation S210, standard cells may be placed. For example, a semiconductor design tool (e.g., a P&R tool) may place a plurality of standard cells by referring to the standard cell library D50 from the netlist data D20. The semiconductor design tool may place standard cells on a grid that intersects a certain length. First, power-gating cells may be distributed at regular intervals, and then standard cells included in a normal cell may be placed.

In operation S220, interconnections may be generated. Interconnection may electrically connect an output pin and an input pin of a standard cell, and may include, for example, at least one via and at least one conductive pattern. By generating interconnections, standard cells may be routed to a power-gating cell.

In operation S230, layout data D30 may be generated. The layout data D30 may have a format such as GDSII, and may include geometric information of standard cells and interconnections.

In operation S300, a mask may be manufactured. For example, patterns formed on a plurality of layers may be defined according to the layout data D30, and at least one mask (or photomask) for forming patterns of each of the plurality of layers may be manufactured.

In operation S400, an integrated circuit may be fabricated. For example, an integrated circuit may be fabricated by patterning a plurality of layers by using at least one mask fabricated in operation S300. As shown in FIG. 28, operation S400 may include operations S410 and S420.

In operation S410, a front-end-of-line (FEOL) process may be performed. The FEOL process may refer to a process of forming individual devices, such as transistors, capacitors, resistors, and the like, on a substrate during an integrated circuit manufacturing process. For example, the FEOL process may include planarizing and cleaning a wafer, forming a trench, forming a well, forming a gate line, forming a source and a drain, and the like.

In operation S420, a back-end-of-line (BEOL) process may be performed. The BEOL process may refer to a process of interconnecting individual devices, such as transistors, capacitors, resistors, and the like, during an integrated circuit manufacturing process. For example, the BEOL process may include silicidizing gate, source, and drain areas, adding a dielectric, planarizing, forming a hole, adding a metal layer, forming a via, forming a passivation layer, and the like. The integrated circuit may then be packaged in a semiconductor package and used as a component in a variety of applications.

Figure 29:
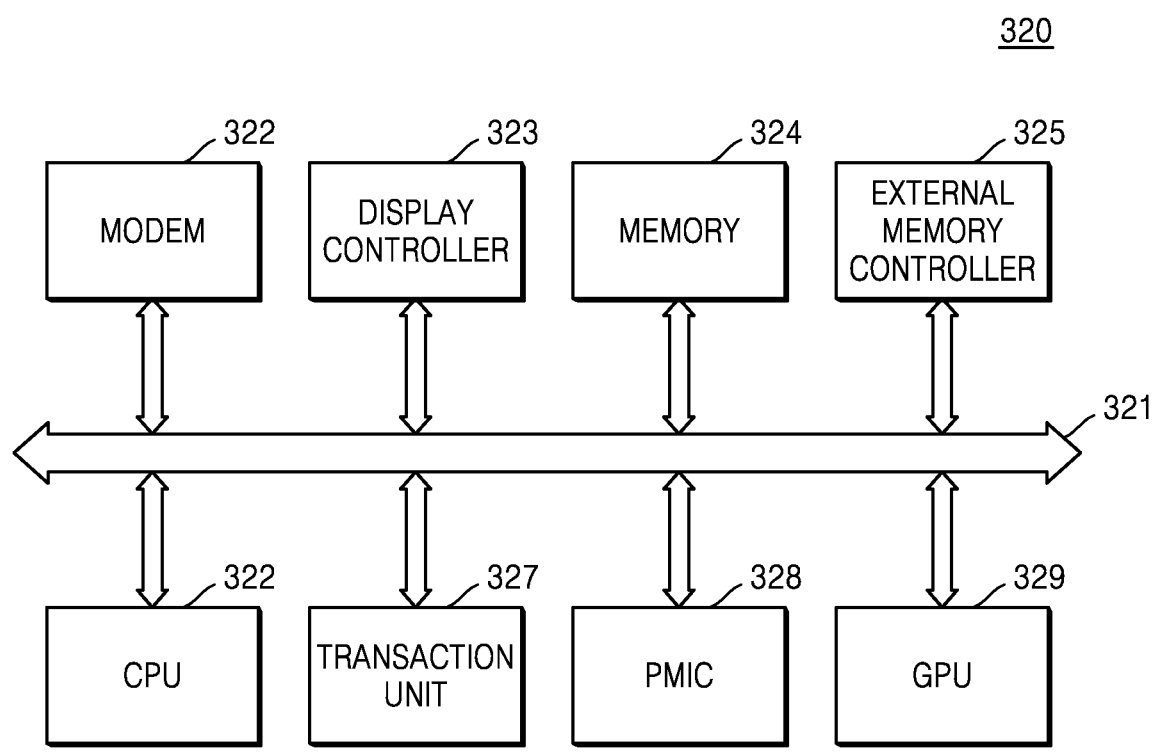
FIG. 29 is a block diagram of a system on chip (SoC) according to an example embodiment.

FIG. 29 is a block diagram of a SoC 320 according to an example embodiment. The SoC 320, which is a semiconductor device, may include an integrated circuit according to an example embodiment. The SoC 320 is implementation of complex functional blocks such as an intellectual property (IP) that performs various functions on a single chip. A standard cell and a power rail according to an example embodiment may be included in each functional block of the SoC 320, and thus the SoC 320 with improved integration and improved routing freedom may be achieved.

Referring to FIG. 29, the SoC 320 may include a modem 322, a display controller 323, a memory 324, an external memory controller 325, a central processing unit (CPU) 326, a transaction unit 327, a power management integrated circuit (PMIC) 328, and a graphics processing unit (GPU) 329, and the function blocks of the SoC 320 may communicate with each other via a system bus 321.

The CPU 326 capable of overall controlling the operation of the SoC 320 may control operations of the other functional blocks 322 to 329. The modem 322 may demodulate a signal received from outside the SoC 320, or may modulate a signal generated in the SoC 320 and transmit the signal outside. The external memory controller 325 may control transmitting and receiving operations of data to/from an external memory device connected to the SoC 320. For example, a program and/or data stored in the external memory device may be provided to the CPU 326 or GPU 329 under the control of the external memory controller 325. The GPU 329 may execute program instructions related to graphics processing. The GPU 329 may receive graphic data through the external memory controller 325, and may transmit the graphic data processed by the GPU 329 outside the SoC 320 through the external memory controller 325. The transaction unit 327 may monitor data transaction of each of the function blocks, and the PMIC 328 may control power supplied to each of the function blocks according to control of the transaction unit 327. The display controller 323 may control a display (or a display device) outside the SoC 320 and may transmit data generated in the SoC 320 to the display.

The memory 324 may include, as a nonvolatile memory, an electrically erasable programmable read-only memory (EEPROM), a flash memory, a phase change random access memory (PRAM), a resistive random access memory (RRAM), a nano-floating gate memory (NFGM), a polymer random access memory (PoRAM), a magnetic random access memory (MRAM), or a ferroelectric random access memory (FRAM), and may include, as a volatile memory, a dynamic random access memory (DRAM), a static RAM (SRAM), a mobile DRAM, a double data rate synchronous DRAM (DDR SDRAM), a low power DDR (LPDDR), a graphic DDR (GDDR) SDRAM, or a rambus DRAM (RDRAM).

Figure 30:
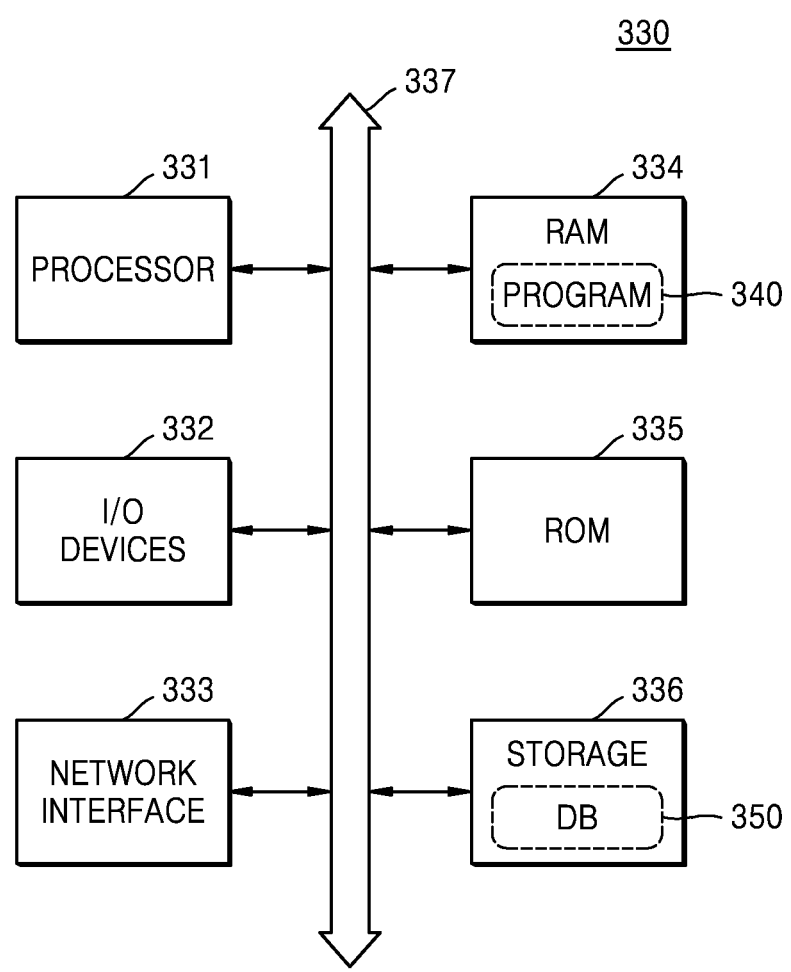
FIG. 30 is a block diagram of a computing system including a memory storing a program according to an example embodiment.

FIG. 30 is a block diagram of a computing system 330 including a memory storing a program according to an example embodiment. At least some of operations included in a method of manufacturing an integrated circuit according to an example embodiment (e.g., the method shown in FIG. 28) may be performed in the computing system 330.

The computing system 330 may be a fixed computing system such as a desktop computer, a workstation, or a server, or may be a portable computing system such as a laptop computer. As shown in FIG. 30, the computing system 330 may include a processor 331, input/output devices 332, a network interface 333, a random access memory (RAM) 334, a read only memory (ROM) 335, and a storage device 336. The processor 331, the input/output devices 332, the network interface 333, the RAM 334, the ROM 335, and the storage device 336 may be connected to a bus 337 and communicate with each other through the bus 337.

The processor 331 may be referred to as a processing unit, and may include at least one core capable of executing an arbitrary set of instructions (e.g., Intel Architecture-32 IA-32 (IA-32), 64-bit extension IA-32, x86-64, PowerPC, Sparc, MIPS, ARM, IA-64, etc.), such as a micro-processor, an application processor (AP), a digital signal processor (DSP), and a graphic processing unit (GPU). For example, the processor 331 may access a memory, that is, the RAM 334 or the ROM 335 through the bus 337, and may execute instructions stored in the RAM 334 or the ROM 335.

The RAM 334 may store a program 340 or at least a portion thereof for manufacturing an integrated circuit according to an example embodiment, and the program 340 may cause the processor 331 to perform at least some of operations included in a method of manufacturing the integrated circuit. That is, the program 340 may include a plurality of instructions executable by the processor 331, and the plurality of instructions included in the program 340 may cause the processor 331 to perform, for example, a logical synthesis operation of operation S100 of FIG. 28 and/or a P&R operation of operation S200.

The storage device 336 may not lose stored data even when the power supplied to the computing system 330 is cut off. For example, the storage device 336 may include a nonvolatile memory device or a storage medium such as a magnetic tape, an optical disk, or a magnetic disk. In addition, the storage device 336 may be detachable from the computing system 330. The storage device 336 may store the program 340 according to an example embodiment, and the program 340 or at least a portion thereof may be loaded into the RAM 334 from the storage device 336 before the program 340 is executed by the processor 331. Alternatively, the storage device 336 may store a file written in a program language, and the program 340 or at least a portion thereof generated by a compiler or the like from a file may be loaded into the RAM 334. In addition, as shown in FIG. 30, the storage device 336 may store a database 350, and the database 350 may include information necessary for designing an integrated circuit.

The storage device 336 may store data to be processed by the processor 331 or data processed by the processor 331. That is, the processor 331 may generate data by processing data stored in the storage device 336 according to the program 340, and may store the generated data in the storage device 336. For example, the storage device 336 may store the RTL data D10, the netlist data D20, and/or the layout data D30.

The input/output devices 332 may include an input device such as a keyboard and a pointing device, and may include an output device such as a display device and a printer. For example, a user may trigger the execution of the program 340 by the processor 331 through the input/output devices 332, may input the RTL data D10 and/or the netlist data D20 of FIG. 28, and may check the layout data D30 of FIG. 28.

The network interface 333 may provide access to a network external to the computing system 330. For example, the network may include multiple computing systems and communication links, and the communication links may include wired links, optical links, wireless links, or any other type of links.

While example embodiments have been particularly shown and described, it will be understood that various changes in form and details may be made therein without departing from the spirit and scope of the following claims.

What is claimed is:

1. An integrated circuit device comprising:
a substrate comprising a first active area and a second active area spaced apart from each other in a first horizontal direction;
a plurality of normal cells arranged on a first surface of the substrate;
a power wiring structure arranged on a second surface of the substrate that is opposite to the first surface;
a power gating cell arranged on the first surface of the substrate; and
a ground line extending in a second horizontal direction on the first surface of the substrate,
wherein the power gating cell comprises:
a sleep control transistor arranged in the first active area; and
a through via penetrating the second active area of the substrate, wherein the through via extends in a vertical direction from the power wiring structure to a power line, and is provided between the ground line and a virtual power line along the first horizontal direction,
wherein the power gating cell is configured to provide a virtual power voltage to the plurality of normal cells through the virtual power line based on a power voltage supplied from the power wiring structure through the through via and the power line,
wherein the virtual power line is spaced apart from the ground line in the first horizontal direction and extends in the second horizontal direction, and
wherein the power line is spaced apart from the ground line in the first horizontal direction and extends in the second horizontal direction.

2. The integrated circuit device of claim 1, wherein the sleep control transistor comprises:
a gate electrode arranged in the first active area and configured to receive a sleep control signal;
a first impurity area arranged on a first side of the gate electrode and electrically connected to the virtual power line; and
a second impurity area arranged on a second side of the gate electrode opposite to the first side and electrically connected to the power line.

3. The integrated circuit device of claim 1, wherein the plurality of normal cells have a first height in the first horizontal direction,
wherein the power gating cell has a second height in the first horizontal direction, and
wherein the second height is equal to the first height, or is twice, four times, or eight times the first height.

4. The integrated circuit device of claim 1, wherein the ground line extends in the second horizontal direction across the power gating cell and at least one of the plurality of normal cells at a first vertical level,
wherein the virtual power line extends in the second horizontal direction at the first vertical level, and
wherein the power line extends in the second horizontal direction at the first vertical level.

5. The integrated circuit device of claim 1, further comprising a deep trench isolation layer arranged on the first surface of the substrate and surrounding at least a portion of a sidewall of the through via,
wherein the deep trench isolation layer and the second active area vertically overlap.

6. The integrated circuit device of claim 1, wherein the through via and the power line vertically overlap, and
wherein one end of the through via is in contact with a bottom surface of the power line.

7. The integrated circuit device of claim 6, wherein the through via extends through the substrate from the first surface to the second surface.

8. The integrated circuit device of claim 1, further comprising a buried power rail having a portion arranged in a first trench of the substrate.

9. The integrated circuit device of claim 8, wherein one end of the through via is in contact with a bottom surface of the buried power rail.

10. An integrated circuit device comprising:
a substrate comprising a first active area and a second active area spaced apart from each other in a first horizontal direction;
a plurality of normal cells arranged on a first surface of the substrate;
a power wiring structure arranged on a second surface of the substrate that is opposite to the first surface;
a power gating cell arranged on the first surface of the substrate, and configured to provide a virtual power voltage to the plurality of normal cells through a virtual power line based on a power voltage supplied from the power wiring structure through a power line; and
a ground line extending in a second horizontal direction on the first surface of the substrate,
wherein the power gating cell comprises:
a sleep control transistor arranged in the first active area; and
a through via penetrating the second active area of the substrate, and electrically connected to the power wiring structure, wherein the through via extends in a vertical direction from the power wiring structure to the power line, and is provided between the ground line and the virtual power line along the first horizontal direction, wherein the sleep control transistor comprises:
- a gate electrode arranged in the first active area and configured to receive a sleep control signal;
- a first impurity area arranged on a first side of the gate electrode; and
- a second impurity area arranged on a second side of the gate electrode opposite to the first side, wherein the virtual power line is spaced apart from the ground line in the first horizontal direction and extends in the second horizontal direction, and wherein the power line is spaced apart from the ground line in the first horizontal direction and extends in the second horizontal direction.

11. The integrated circuit device of claim 10, wherein the virtual power line is configured to apply the virtual power voltage to the first impurity area,
wherein the power line is configured to apply the power voltage to the second impurity area, and
wherein the power line and the through via vertically overlap.

12. The integrated circuit device of claim 11, wherein the ground line extends in the second horizontal direction at a first vertical level on the first surface of the substrate,
wherein the virtual power line extends in the second horizontal direction at the first vertical level, and
wherein the power line extends in the second horizontal direction at the first vertical level.

13. The integrated circuit device of claim 12, further comprising at least one dummy wiring line spaced apart from the virtual power line in the first horizontal direction at the first vertical level and extending in the second horizontal direction,
wherein the at least one dummy wiring line is electrically isolated from the through via.

14. The integrated circuit device of claim 12, further comprising at least one dummy wiring line spaced apart from the virtual power line in the first horizontal direction at the first vertical level and extending in the second horizontal direction,
wherein a portion of the at least one dummy wiring line and the through via vertically overlap, and
wherein the portion of the at least one dummy wiring line is electrically connected to the through via.

15. The integrated circuit device of claim 12, wherein the through via has a first width in the first horizontal direction, and
wherein the power line has a second width greater than or equal to the first width in the first horizontal direction.

16. The integrated circuit device of claim 15, wherein the virtual power line has a third width less than or equal to the second width in the first horizontal direction.

17. The integrated circuit device of claim 16, wherein the ground line has a fourth width equal to the third width in the first horizontal direction,
wherein each of the power line and the ground line extends in the second horizontal direction, and
wherein the power line and the ground line are offset from each other along the first horizontal direction.

18. The integrated circuit device of claim 17, wherein the first width is between 10 nm and 500 nm, and
wherein the second width is between 50 nm and 600 nm.

19. An integrated circuit device comprising:
- a substrate comprising a first active area and a second active area spaced apart from each other in a first horizontal direction;
- a plurality of normal cells arranged on a first surface of the substrate;
- a power wiring structure arranged on a second surface of the substrate that is opposite to the first surface;
- a power gating cell arranged on the first surface of the substrate; and
- a ground line extending in a second horizontal direction on the first surface of the substrate, wherein the power gating cell comprises:
- a through via penetrating the second active area of the substrate;
- a sleep control transistor in the first active area, the sleep control transistor comprising:
  - a gate electrode arranged in the first active area and configured to receive a sleep control signal;
  - a first impurity area arranged on a first side of the gate electrode; and
  - a second impurity area arranged on a second side of the gate electrode opposite to the first side;
- a virtual power line configured to apply a virtual power voltage to the first impurity area; and
- a power line configured to apply a power voltage supplied from the power wiring structure through the through via to the second impurity area, the power line vertically overlapping the through via, wherein the through via extends in a vertical direction from the power wiring structure to the power line, and is provided between the ground line and the virtual power line along the first horizontal direction, wherein the virtual power line is spaced apart from the ground line in the first horizontal direction and extends in the second horizontal direction, and wherein the power line is spaced apart from the ground line in the first horizontal direction and extends in the second horizontal direction.

20. The integrated circuit device of claim 19, wherein the power gating cell further comprises a controller configured to generate the sleep control signal according to a control signal received from an external power management circuit.

* * * * *